(12) United States Patent
Terasaki et al.

(10) Patent No.: US 10,173,282 B2
(45) Date of Patent: Jan. 8, 2019

(54) BONDED BODY AND POWER MODULE SUBSTRATE

(71) Applicant: MITSUBISHI MATERIALS CORPORATION, Tokyo (JP)

(72) Inventors: Nobuyuki Terasaki, Saitama (JP); Yoshiyuki Nagatomo, Saitama (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 29 days.

(21) Appl. No.: 14/909,282

(22) PCT Filed: Aug. 18, 2014

(86) PCT No.: PCT/JP2014/071523
§ 371 (c)(1),
(2) Date: Feb. 1, 2016

(87) PCT Pub. No.: WO2015/029810
PCT Pub. Date: Mar. 5, 2015

(65) Prior Publication Data
US 2016/0167170 A1 Jun. 16, 2016

(30) Foreign Application Priority Data
Aug. 26, 2013 (JP) .................................. 2013-175000

(51) Int. Cl.
*B23K 26/324* (2014.01)
*B23K 26/00* (2014.01)
(Continued)

(52) U.S. Cl.
CPC ........ *B23K 26/324* (2013.01); *B23K 26/0006* (2013.01); *B23K 26/32* (2013.01);
(Continued)

(58) Field of Classification Search
CPC .............. B23K 2203/52; B23K 35/302; C04B 2237/361; C04B 2237/363;
(Continued)

(56) References Cited

U.S. PATENT DOCUMENTS

| 4,460,658 A | 7/1984 | Bose et al. |
| 4,729,504 A | 3/1988 | Edamura |

(Continued)

FOREIGN PATENT DOCUMENTS

| CN | 1152371 A | 6/1997 |
| CN | 1167742 A | 12/1997 |

(Continued)

OTHER PUBLICATIONS

Office Action dated Sep. 19, 2016, issued for U.S. Appl. No. 14/913,845.
(Continued)

*Primary Examiner* — Dana Ross
*Assistant Examiner* — Joe E Mills, Jr.
(74) *Attorney, Agent, or Firm* — Locke Lord LLP; James E. Armstrong, IV; Nicholas J. DiCeglie, Jr.

(57) ABSTRACT

The bonded body of the present invention includes: a ceramic member made of ceramics; and a Cu member which is made of Cu or a Cu alloy and bonded to the ceramic member through a Cu—P—Sn-based brazing filler material and a Ti material, wherein a Cu—Sn layer, which is positioned close to the ceramic member and in which Sn forms a solid solution with Cu, and a Ti layer which is positioned between the Cu member and the Cu—Sn layer, are formed at a bonded interface between the ceramic member and the Cu member, a first intermetallic compound layer made of Cu and Ti is formed between the Cu member and the Ti layer, and a second intermetallic compound layer containing P is formed between the Cu—Sn layer and the Ti layer.

20 Claims, 11 Drawing Sheets

(51) Int. Cl.
*B23K 35/26* (2006.01)
*B23K 35/30* (2006.01)
*B23K 35/02* (2006.01)
*C04B 37/02* (2006.01)
*C22C 9/00* (2006.01)
*C22C 9/02* (2006.01)
*H01L 23/373* (2006.01)
*H01L 21/48* (2006.01)
*B23K 35/28* (2006.01)
*B23K 26/32* (2014.01)
*B23K 26/322* (2014.01)
*H01L 23/15* (2006.01)
*H01L 23/473* (2006.01)
*B23K 103/08* (2006.01)

(52) U.S. Cl.
CPC .......... *B23K 26/322* (2013.01); *B23K 35/025* (2013.01); *B23K 35/0222* (2013.01); *B23K 35/0238* (2013.01); *B23K 35/262* (2013.01); *B23K 35/286* (2013.01); *B23K 35/30* (2013.01); *B23K 35/302* (2013.01); *C04B 37/02* (2013.01); *C22C 9/00* (2013.01); *C22C 9/02* (2013.01); *H01L 21/4882* (2013.01); *H01L 23/3735* (2013.01); *B23K 2203/08* (2013.01); *H01L 23/15* (2013.01); *H01L 23/473* (2013.01); *H01L 2224/32225* (2013.01); *H01L 2924/0002* (2013.01)

(58) Field of Classification Search
CPC . C04B 2237/365; C04B 37/001; E21B 10/55; E21B 10/5735; H01L 2924/0002; H01L 2924/00; H01L 21/4846; H01L 21/4882; H01L 2224/32225; H01L 23/15; H01L 23/3735; H01L 23/473; H01L 23/49838; H01L 23/49866; H05K 1/0201
USPC .............................. 29/846, 825; 257/E23.109
See application file for complete search history.

(56) References Cited

U.S. PATENT DOCUMENTS

| | | | |
|---|---|---|---|
| 5,378,294 A | 1/1995 | Rissanen | |
| 5,561,321 A | 10/1996 | Hirano et al. | |
| 5,955,686 A | 9/1999 | Sakuraba et al. | |
| 6,232,657 B1 | 5/2001 | Komorita et al. | |
| 6,261,703 B1 | 7/2001 | Sasaki et al. | |
| 6,457,233 B1 | 10/2002 | Shimizu | |
| 6,773,535 B1 | 8/2004 | Wetzel | |
| 6,967,065 B1 | 11/2005 | Saitou et al. | |
| 7,219,826 B2 | 5/2007 | Nakamura | |
| 2004/0188828 A1* | 9/2004 | Nagatomo | H01L 23/3735 257/703 |
| 2004/0262367 A1* | 12/2004 | Nakamura | H01L 23/3735 228/122.1 |
| 2005/0029666 A1* | 2/2005 | Kurihara | H01L 21/561 257/772 |
| 2005/0249629 A1* | 11/2005 | Harris | B23K 35/302 420/472 |
| 2006/0244125 A1 | 11/2006 | Shiomi et al. | |
| 2009/0104572 A1 | 4/2009 | Gao et al. | |
| 2009/0130480 A1 | 5/2009 | Hatano | |
| 2009/0283309 A1* | 11/2009 | Naba | B23K 35/30 174/258 |
| 2010/0247955 A1 | 9/2010 | Takahashi et al. | |
| 2010/0258233 A1* | 10/2010 | Tonomura | H01L 21/4807 156/64 |
| 2011/0074010 A1* | 3/2011 | Kuromitsu | H01L 23/3735 257/703 |
| 2012/0154974 A1 | 6/2012 | Bhatnagar et al. | |
| 2012/0298408 A1* | 11/2012 | Nagatomo | H01L 23/142 174/260 |
| 2013/0010429 A1* | 1/2013 | Tonomura | H01L 23/3735 361/720 |
| 2013/0270001 A1 | 10/2013 | Nakano et al. | |
| 2013/0299963 A1* | 11/2013 | Otaki | H01L 23/36 257/712 |
| 2014/0111956 A1* | 4/2014 | Taniguchi | B23K 35/02 361/771 |
| 2014/0182824 A1* | 7/2014 | Hirotsuru | C25D 5/12 165/133 |
| 2015/0208496 A1* | 7/2015 | Terasaki | B23K 35/30 361/760 |
| 2015/0217410 A1 | 8/2015 | Fujimaki et al. | |
| 2015/0273401 A1 | 10/2015 | Miller et al. | |

FOREIGN PATENT DOCUMENTS

| | | | | |
|---|---|---|---|---|
| CN | 101214588 A | 7/2008 | | |
| CN | 101861647 A | 10/2010 | | |
| DE | 3618102 A1 | 2/1987 | | |
| EP | 0743131 A1 | 11/1996 | | |
| EP | 2689881 A1 * | 1/2014 | ........... | B23K 1/0008 |
| EP | 2978018 A1 | 1/2016 | | |
| EP | 2978019 A1 | 1/2016 | | |
| JP | 58-100995 A | 6/1983 | | |
| JP | 04-295065 A | 10/1992 | | |
| JP | H08-222670 A | 8/1996 | | |
| JP | 09-070686 A | 3/1997 | | |
| JP | 10-102167 A | 4/1998 | | |
| JP | 10-286666 A | 10/1998 | | |
| JP | 2001-085571 A | 3/2001 | | |
| JP | 2008-041755 A | 2/2008 | | |
| JP | 2008-221290 A | 9/2008 | | |
| JP | 4350753 B2 | 10/2009 | | |
| JP | 4375730 B2 | 12/2009 | | |
| JP | 2011-108999 A | 6/2011 | | |
| JP | 2013-098387 A | 5/2013 | | |
| TW | 419623 B | 1/2001 | | |
| TW | 201234939 A | 8/2012 | | |
| TW | 201309410 A | 3/2013 | | |
| TW | 201322385 A | 6/2013 | | |
| WO | 2004/018147 A1 | 3/2004 | | |
| WO | 2013/024813 A1 | 2/2013 | | |

OTHER PUBLICATIONS

International Search Report dated Nov. 18, 2014, issued for PCT/JP2014/071524 and English translation thereof.
Notice of Allowance dated Dec. 20, 2016, issued for the Japanese patent application No. 2013-175000 and English translation thereof.
Search Report dated Feb. 24, 2017, issued for the European Patent Application No. 14841139.0.
Search Report dated Mar. 8, 2017, issued for the European Patent Application No. 14839112.1.
Office Action dated Aug. 2, 2017, issued for the Chinese patent application No. 201480040924.2 and English translation thereof.
Office Action dated Aug. 21, 2017, issued for the Chinese patent application No. 201480041129.5 and a partial English translation of Search Report.
International Search Report dated Nov. 18, 2014, issued for PCT/JP2014/071523.
Office Action dated Nov. 3, 2017, issued for the Taiwanese patent application No. 103128294 and English translation thereof.
Office Action dated Nov. 6, 2017, issued for the European patent application No. 14841139.0.
Office Action dated Nov. 20, 2017, issued for the Taiwanese patent application No. 103128291 and English translation thereof.
Notice of Allowance issued in corresponding Japanese Patent Application No. JP 2014-165909, dated Jan. 9, 2018.

* cited by examiner

BONDED BODY AND POWER MODULE SUBSTRATE

TECHNICAL FIELD

The invention relates to a bonded body in which a ceramic member is bonded to a Cu member, and a power module substrate in which a circuit layer is formed on one surface of a ceramic substrate.

Priority is claimed on Japanese Patent Application No. 2013-175000, filed Aug. 26, 2013, the contents of which are incorporated herein by reference.

BACKGROUND ART

Semiconductor devices such as an LED and a power module have a structure in which semiconductor elements are bonded to an upper surface of a circuit layer made of a conductive material.

A high-power control power semiconductor element used to control wind power generation systems and electric vehicles such as electric automobiles radiates a large amount of heat. For this reason, in the related art, a power module substrate, in which a metal plate with superior electrical conductivity as a circuit layer is bonded to one surface of a ceramic substrate made of aluminum nitride (AlN) or the like, is widely used as a substrate on which such power semiconductor elements are mounted. In another type of power module substrate, a metal plate as a metal layer may be bonded to the other surface of the ceramic substrate.

A power module substrate disclosed in PTL 1 has a structure in which a circuit layer is formed by bonding a Cu foil (Cu member) to one surface of a ceramic substrate (ceramic member). The power module substrate is formed by bonding the Cu foil to the ceramic substrate through the heating of the Cu foil which is disposed on the one surface of the ceramic substrate with a Cu—Mg—Ti brazing filler material interposed between the Cu foil and the ceramic substrate.

CITATION LIST

Patent Literature

[PTL 1] Japanese Patent No. 4375730

SUMMARY OF INVENTION

Technical Problem

As disclosed in PTL 1, when the ceramic substrate and the Cu foil are bonded to each other through the Cu—Mg—Ti brazing filler material, an intermetallic compound containing Cu, Mg, or Ti is formed in the vicinity of the ceramic substrate.

Since the intermetallic compound formed in the vicinity of the ceramic substrate is rigid, when the power module substrate undergoes a thermal cycle, thermal stress generating in the ceramic substrate is increased, and cracking is likely to occur in the ceramic substrate, which is a problem. In addition, since the above-mentioned intermetallic compound layer is brittle, when the power module substrate undergoes a thermal cycle, the intermetallic compound is broken, the bonding rate between the ceramic substrate and the circuit layer is decreased, and the reliability of bonding therebetween decreases, which is a problem.

In particular, recently, power modules are used under severe environments, and conditions of thermal cycles are getting more severe. Thus, in the power module substrate, there are tendencies that cracking is likely to occur in the ceramic substrate and the reliability of bonding between the ceramic substrate and the circuit layer is likely to decrease.

The present invention is made in light of these problems, and an object of the invention is to provide a bonded body and a power module substrate in which the occurrence of cracking in a ceramic member can be limited when the bonded body and the power module substrate undergo a thermal cycle, and the reliability of bonding between the ceramic member and a Cu member can be improved.

Solution to Problem

According to a first aspect of the present invention, in order to solve these problems, there is provided a bonded body including: a ceramic member made of ceramics; and a Cu member which is made of Cu or a Cu alloy and bonded to the ceramic member through a Cu—P—Sn-based brazing filler material and a Ti material, in which a Cu—Sn layer, which is positioned close to the ceramic member and in which Sn forms a solid solution with Cu, and a Ti layer which is positioned between the Cu member and the Cu—Sn layer, are formed at a bonded interface between the ceramic member and the Cu member, a first intermetallic compound layer made of Cu and Ti is formed between the Cu member and the Ti layer, and a second intermetallic compound layer containing P is formed between the Cu—Sn layer and the Ti layer.

In the bonded body according to the first aspect of the present invention, P contained in the Cu—P—Sn-based brazing filler material is drawn into the second intermetallic compound layer formed close to the Ti layer at the bonded interface between the ceramic member and the Cu member. Accordingly, the Cu—Sn layer without an intermetallic compound containing P or with a very small amount of an intermetallic compound containing P is formed close to the ceramic member. That is, since a rigid intermetallic compound is not formed in the vicinity of the ceramic member, it is possible to reduce thermal stress generating in the ceramic member when the bonded body undergoes a thermal cycle. As a result, it is possible to limit the occurrence of cracking in the ceramic member. Further, since a brittle intermetallic compound is not formed in the vicinity of the ceramic substrate, it is possible to limit a decrease in the bonding rate between the ceramic member and the Cu member when the bonded body undergoes a thermal cycle, and it is possible to improve the reliability of bonding therebetween.

The Ti layer is formed between the Cu—Sn layer and the Cu member, and thus it is possible to prevent Sn from diffusing to the Cu member. Therefore, when the ceramic member and the Cu member are bonded to each other through the Cu—P—Sn-based brazing filler material, it is possible to limit an increase in the melting point of the Cu—P—Sn-based brazing filler material.

The first intermetallic compound layer made of Cu and Ti is formed between the Cu member and the Ti layer. Thus, Cu in the Cu member sufficiently diffuses through the Ti layer and Ti in the Ti layer sufficiently diffuses through the Cu member. Accordingly, the Cu member and the Ti layer are bonded sufficiently.

A thickness of the first intermetallic compound layer is preferably set to be in a range of 0.5 μm to 10 μm.

When the thickness of the first intermetallic compound layer made of Cu and Ti is 0.5 µm or more, Cu in the Cu member sufficiently diffuses through the Ti layer and Ti in the Ti layer sufficiently diffuses through the Cu member. Thus, it is possible to ensure the bonding strength between the Cu member and the Ti layer. When the thickness of the first intermetallic compound layer is 10 µm or less, the rigid first intermetallic compound layer is thin, and thus it is possible to reduce thermal stress generating in the ceramic member when the bonded body undergoes a thermal cycle. Accordingly, it is possible to reliably limit the occurrence of cracking in the ceramic member and to further improve the reliability of bonding between the ceramic member and the Cu member.

A thickness of the Ti layer is preferably set to be in a range of 1 µm to 15 µm.

Since the thickness of the Ti layer is set to be 1 µm to 15 µm, it is possible to reliably limit the diffusion of Sn to the Cu member. Therefore, when the ceramic member and the Cu member are bonded to each other through the Cu—P—Sn-based brazing filler material, it is possible to limit an increase in the melting point of the Cu—P—Sn-based brazing filler material. Since the Ti layer with a relatively higher strength does not have a large thickness, when the bonded body undergoes a thermal cycle, it is possible to reduce thermal stress generating in the ceramic member and to limit the occurrence of cracking in the ceramic substrate. For this reason, the thickness of the Ti layer is preferably set to be in the aforementioned range.

According to a second aspect of the present invention, there is provided a power module substrate including the above-mentioned bonded body, in which the substrate further includes: a ceramic substrate formed of the ceramic member; and a circuit layer formed by bonding a Cu foil formed of the Cu member to a first surface of the ceramic substrate through the Cu—P—Sn-based brazing filler material, and in which the Cu—Sn layer, which is positioned close to the ceramic substrate and in which Sn forms a solid solution with Cu, and the Ti layer which is positioned between the circuit layer and the Cu—Sn layer, are formed at a bonded interface between the ceramic substrate and the circuit layer, the first intermetallic compound layer made of Cu and Ti is formed between the circuit layer and the Ti layer, and the second intermetallic compound layer containing P is formed between the Cu—Sn layer and the Ti layer.

In the power module substrate according to the second aspect of the present invention, P contained in the Cu—P—Sn-based brazing filler material is drawn into the second intermetallic compound layer formed close to the Ti layer at the bonded interface between the ceramic substrate and the circuit layer. Accordingly, the Cu—Sn layer without an intermetallic compound containing P or with a very small amount of an intermetallic compound containing P is formed close to the ceramic substrate. That is, since a rigid intermetallic compound is not formed in the vicinity of the ceramic substrate, it is possible to reduce thermal stress generating in the ceramic substrate when the power module substrate undergoes a thermal cycle. As a result, it is possible to limit the occurrence of cracking in the ceramic substrate. Further, since a brittle intermetallic compound is not formed in the vicinity of the ceramic substrate, it is possible to limit a decrease in the bonding rate between the ceramic substrate and the circuit layer when the power module substrate undergoes a thermal cycle, and it is possible to improve the reliability of bonding therebetween.

The Ti layer is formed between the Cu—Sn layer and the circuit layer, and thus it is possible to prevent Sn from diffusing to the circuit layer. Therefore, when and the circuit layer is formed on the first surface of the ceramic substrate through the Cu—P—Sn-based brazing filler material, it is possible to limit an increase in the melting point of the Cu—P—Sn-based brazing filler material.

The first intermetallic compound layer made of Cu and Ti is formed between the circuit layer and the Ti layer. Thus, Cu in the circuit layer sufficiently diffuses through the Ti layer and Ti in the Ti layer sufficiently diffuse through the circuit layer. Accordingly, the circuit layer and the Ti layer are sufficiently bonded to each other.

In the power module substrate according to the second aspect of the present invention, a metal layer is preferably formed on a second surface of the ceramic substrate.

Since the metal layer is formed on the second surface of the ceramic substrate, the power module substrate is capable of efficiently dissipating heat from a ceramic substrate side through the metal layer.

It is preferable that the metal layer is formed by bonding a Cu foil made of Cu or a Cu alloy to the second surface of the ceramic substrate through a Cu—P—Sn-based brazing filler material and a Ti material, a Cu—Sn layer, which is positioned close to the ceramic substrate and in which Sn forms a solid solution with Cu, and a Ti layer which is positioned between the metal layer and the Cu—Sn layer, are formed at a bonded interface between the ceramic substrate and the metal layer, a first intermetallic compound layer made of Cu and Ti is formed between the metal layer and the Ti layer, and a second intermetallic compound layer containing P is formed between the Cu—Sn layer and the Ti layer.

In this case, P contained in the Cu—P—Sn-based brazing filler material is drawn into the second intermetallic compound layer formed close to the Ti layer at the bonded interface between the ceramic substrate and the metal layer. Accordingly, the Cu—Sn layer without an intermetallic compound containing P or with a very small amount of an intermetallic compound containing P is formed close to the ceramic substrate. That is, since a rigid intermetallic compound is not formed in the vicinity of the ceramic substrate, it is possible to reduce thermal stress generating in the ceramic substrate when the power module substrate undergoes a thermal cycle. As a result, it is possible to limit the occurrence of cracking in the ceramic substrate. Further, since a brittle intermetallic compound is not formed in the vicinity of the ceramic substrate, it is possible to limit a decrease in the bonding rate between the ceramic substrate and the metal layer when the power module substrate undergoes a thermal cycle, and it is possible to improve the reliability of bonding.

The Ti layer is formed between the Cu—Sn layer and the metal layer, and thus it is possible to prevent Sn from diffusing to the metal layer. Therefore, when and the metal layer is formed on the second surface of the ceramic substrate through the Cu—P—Sn-based brazing filler material, it is possible to limit an increase in the melting point of the Cu—P—Sn-based brazing filler material. The first intermetallic compound layer made of Cu and Ti is formed between the metal layer and the Ti layer. Thus, Cu in the metal layer sufficiently diffuses through the Ti layer and Ti in the Ti layer sufficiently diffuses through the metal layer. Accordingly, the metal layer and the Ti layer are sufficiently bonded to each other.

The metal layer may be made of Al or an Al alloy.

In this case, the metal layer made of Al or an Al alloy has low strength, and thus it is possible to reduce thermal stress generating in the ceramic substrate when the power module substrate undergoes a thermal cycle.

In the power module substrate according to the second aspect of the present invention, a thickness of the Ti layer is preferably set to be in a range of 1 μm to 15 μm.

Since the thickness of the Ti layer is set to be 1 μm to 15 μm, it is possible to reliably limit the diffusion of Sn to the circuit layer or the metal layer. Therefore, the Ti layer with a thermal resistance larger than that of the circuit layer or the metal layer does not have a large thickness, and thus the thermal resistance of the power module substrate is not increased. Further, in this case, since the Ti layer with a relatively higher strength does not have a large thickness, when the power module substrate undergoes a thermal cycle, it is possible to reduce thermal stress generating in the ceramic substrate and to limit the occurrence of cracking in the ceramic substrate. For this reason, the thickness of the Ti layer is preferably set to be in the aforementioned range.

Advantageous Effects of Invention

According to the present invention, it is possible to provide the bonded body and the power module substrate in which the occurrence of cracking in the ceramic member can be limited when the bonded body and the power module substrate undergo a thermal cycle, and the reliability of bonding between a ceramic member and a Cu member can be improved.

DESCRIPTION OF EMBODIMENTS

First Embodiment

Hereinafter, embodiments of the present invention will be described with reference to the accompanying drawings. First, a first embodiment of the present invention will be described.

Figure 1:
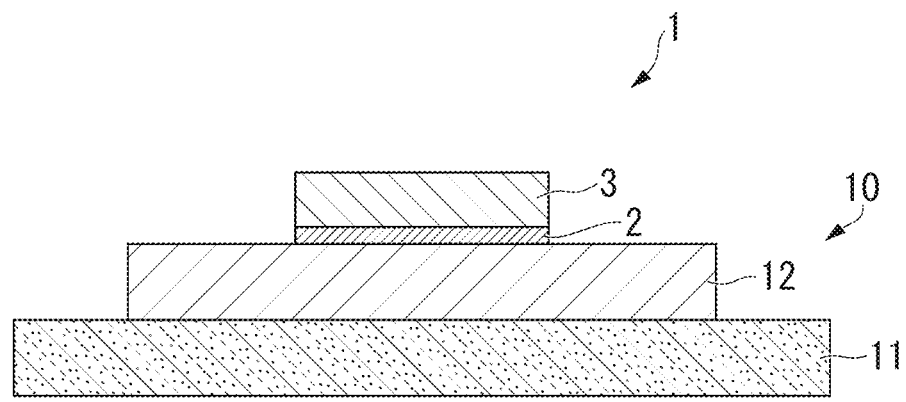
FIG. 1 is a schematic view of a power module in which a power module substrate is used in a first embodiment of the present invention.

A bonded body in the embodiment is a power module substrate 10 in which a ceramic substrate 11 formed of a ceramic member, and a Cu foil 22 (a circuit layer 12) formed of a Cu member, are bonded to each other. FIG. 1 shows a power module 1 including the power module substrate 10 in the embodiment.

The power module 1 includes the power module substrate 10 on which the circuit layer 12 is provided, and a semi-conductor element 3 that is bonded to one surface (an upper surface in FIG. 1) of the circuit layer 12 through a bonding layer 2.

Figure 2:
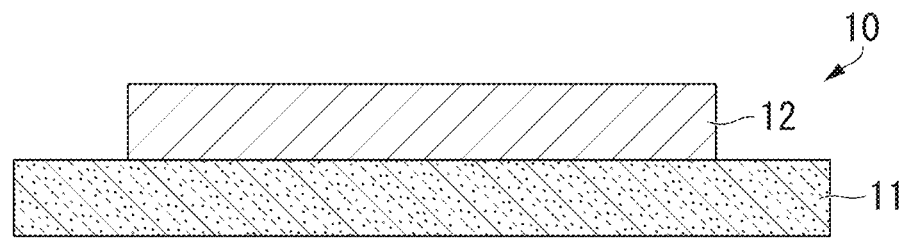
FIG. 2 is a schematic view of the power module substrate in the first embodiment of the present invention.

As shown in FIG. 2, the power module substrate 10 includes the ceramic substrate 11 including a first surface and a second surface, and the circuit layer 12 that is provided on the first surface (an upper surface in FIG. 2) which is one surface of the ceramic substrate 11.

The ceramic substrate 11 is made of high-insulation ceramics such as aluminum nitride (AlN), silicon nitride ($Si_3N_4$), and alumina ($Al_2O_3$). In the embodiment, the ceramic substrate 1 is made of aluminum nitride (AlN) having good heat radiation. The thickness of the ceramic substrate 11 is set to be in a range of 0.2 mm to 1.5 mm. In the embodiment, the thickness is set to 0.635 mm.

The circuit layer 12 is formed by bonding an electrically-conductive metal plate (the Cu foil 22) made of Cu or a Cu alloy to the first surface of the ceramic substrate 11 through a Cu—P—Sn-based brazing filler material and Ti foil 25 as a Ti material. The Cu foil 22 may be made of oxygen-free copper, deoxidized copper, tough pitch copper, or the like. In the embodiment, the Cu foil 22 is made of oxygen-free copper. The thickness of the Cu foil 22 is preferably set to be in a range of 0.1 mm to 1.0 mm. In the embodiment, the thickness is set to 0.6 mm.

Specific examples of the Cu—P—Sn-based brazing filler material include a Cu—P—Sn brazing filler material, a Cu—P—Sn—Ni-based brazing filler material, a Cu—P—Sn—Zn-based brazing filler material, a Cu—P—Sn—Mn-based brazing filler material, and a Cu—P—Sn—Cr-based brazing filler material. The Cu—P—Sn-based brazing filler material preferably contains 3 mass % to 10 mass % of P, and 0.5 mass % to 25 mass % of Sn. In the embodiment, a Cu—P—Sn—Ni brazing filler material 24 is used as the Cu—P—Sn-based brazing filler material. Preferably, the Cu—P—Sn-based brazing filler material is a foil shape and the thickness thereof is in a range of 5 μm to 150 μm.

The Cu—P—Sn-based brazing filler material has a melting point of 710° C. or less. The Cu—P—Sn—Ni brazing filler material 24 used in the embodiment has a melting point of 580° C. In the embodiment, the solidus temperature of the Cu—P—Sn-based brazing filler material is used as the melting point.

Figure 5:
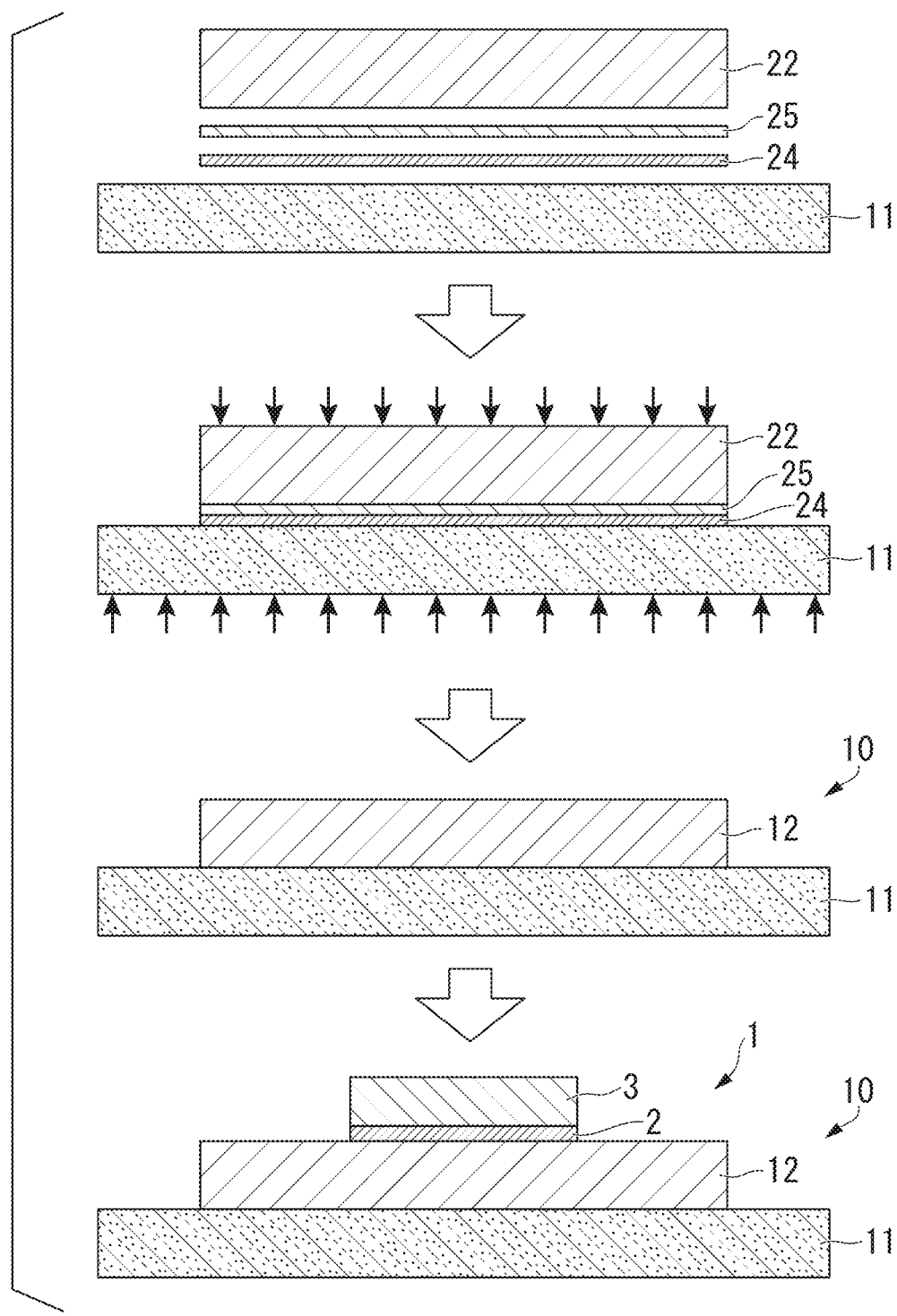
FIG. 5 shows schematic views showing the method of producing the power module substrate and the power module in the first embodiment of the present invention.

In the embodiment, the circuit layer 12 is formed by bonding the Cu foil 22 to the ceramic substrate 11 through the heating of the Cu—P—Sn—Ni brazing filler material 24, the Ti foil 25 as a Ti material, and the Cu foil 22 made of oxygen-free copper, which are laminated on the first surface of the ceramic substrate 11 (refer to FIG. 5).

The thickness of the circuit layer 12 is set to be in a range of 0.1 mm to 1.0 mm. In the embodiment, the thickness is set to 0.6 mm.

Figure 3:
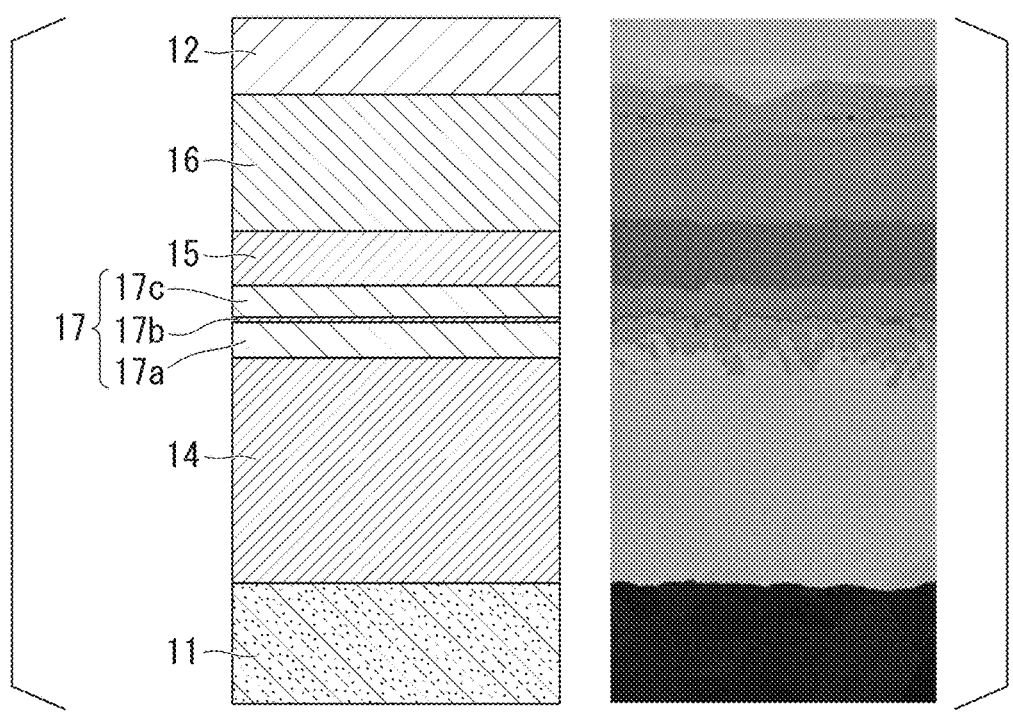
FIG. 3 is an electron micrograph obtained by capturing an image of the section of the bonded interface between a circuit layer and a ceramic substrate shown in FIG. 2, and a schematic view thereof.

FIG. 3 shows an electron micrograph of the bonded interface between the ceramic substrate 11 and the circuit layer 12, and a schematic view thereof. As shown in FIG. 3, a Cu—Sn layer 14 and a Ti layer 15 are formed at the bonded interface between the ceramic substrate 11 and the circuit layer 12. The Cu—Sn layer 14 is positioned close to the ceramic substrate 11, and the Ti layer 15 is positioned between the circuit layer 12 and the Cu—Sn layer 14.

A first intermetallic compound layer 16 made of Cu and Ti is formed between the circuit layer 12 and the Ti layer 15. A second intermetallic compound layer 17 containing P and Ni is formed between the Cu—Sn layer 14 and the Ti layer 15.

The Cu—Sn layer 14 is a layer in which Sn forms a solid solution with Cu. P and Ni contained in the Cu—P—Sn—Ni brazing filler material 24 is drawn into the second intermetallic compound layer 17 formed close to the Ti layer 15, and thereby the Cu—Sn layer 14 is formed. The thickness of the Cu—Sn layer 14 may be set to be in a range of 1 μm to 140 μm.

As described above, the Ti layer 15 is formed by bonding the ceramic substrate 11 and Cu foil 22 are bonded to each other through the Cu—P—Sn—Ni brazing filler material 24 and the Ti foil 25. In the embodiment, the thickness of the Ti layer 15 is preferably set to be 1 μm to 15 μm.

When the thickness of the Ti layer 15 is set to be 1 μm to 15 μm, the Ti layer acts reliably as a barrier layer which prevents Sn from diffusing to the circuit layer 12. Thereby, it is possible to reliably limit the diffusion of Sn. The Ti layer has a thermal resistance larger than that of the circuit layer 12 made of Cu foil 22. Since such Ti layer 15 does not have a large thickness, it is possible to limit an increase of the thermal resistance of the power module substrate 10. Further, the Ti layer has a relatively higher strength. Since such Ti layer 15 does not have a large thickness, when the power module substrate 10 undergoes a thermal cycle, it is possible to reduce thermal stress being generated in the ceramic substrate 11 and to limit the occurrence of cracking in the ceramic substrate 11. For this reason, the thickness of the Ti layer 15 is preferably set to be in the aforementioned range. The thickness of the Ti layer 15 may be set to be 1 μm to 5 μm.

Cu in the circuit layer 12 diffuses through the Ti layer 15 and Ti in the Ti layer 15 diffuses through the circuit layer 12. Thereby, the first intermetallic compound layer 16 is formed. Here, Cu and Ti diffuse in solids. The first intermetallic compound layer 16 includes at least one or more of a $Cu_4Ti$ phase, a $Cu_3Ti_2$ phase, a $Cu_4Ti_3$ phase, a $CuTi$ phase, and a $CuTi_2$ phase. In the embodiment, the first intermetallic compound layer 16 has the $Cu_4Ti$ phase, the $Cu_3Ti_2$ phase, the $Cu_4Ti_3$ phase, the $CuTi$ phase, and the $CuTi_2$ phase.

In the embodiment, the thickness of the first intermetallic compound layer 16 is set to be 0.5 μm to 10 μm.

When the thickness of the first intermetallic compound layer 16 is 0.5 μm or more, Cu in the circuit layer 12 sufficiently diffuses through the Ti layer 15 and Ti in the Ti layer 15 sufficiently diffuses through the circuit layer 12. Thus, it is possible to sufficiently ensure the bonding strength between the circuit layer 12 and the Ti layer 15. When the thickness of the first intermetallic compound layer 16 is 10 μm or less, the rigid first intermetallic compound layer 16 is thin. Thus, when the power module substrate 10 undergoes a thermal cycle, it is possible to reduce the thermal stress being generated in the ceramic substrate 11 and to limit the occurrence of cracking.

For this reason, the thickness of the first intermetallic compound layer 16 is set to be in the aforementioned range. The thickness of the first intermetallic compound layer 16 may be set to be 0.5 μm to 7 μm.

P and Ni contained in the Cu—P—Sn—Ni brazing filler material 24 are combined with Ti contained in the Ti foil 25, and thereby the second intermetallic compound layer 17 is formed. In the embodiment, as shown in FIG. 3, the second intermetallic compound layer 17 has a P—Ni—Ti layer 17a, a P—Ti layer 17b, and a Cu—Ni—Ti layer 17c which are formed in this order from the Cu—Sn layer 14. The thickness of the second intermetallic compound layer 17, that is, the total thickness of the P—Ni—Ti layer 17a, the P—Ti layer 17b, and the Cu—Ni—Ti layer 17c may be 0.5 μm to 6 μm.

The semiconductor element 3 is made of a semiconductor material such as Si. The semiconductor element 3 and the circuit layer 12 are bonded to each other through the bonding layer 2.

The bonding layer 2 is made of a Sn—Ag-based solder material, a Sn—In-based solder material, a Sn—Ag—Cu-based solder material, or the like.

Figure 4:
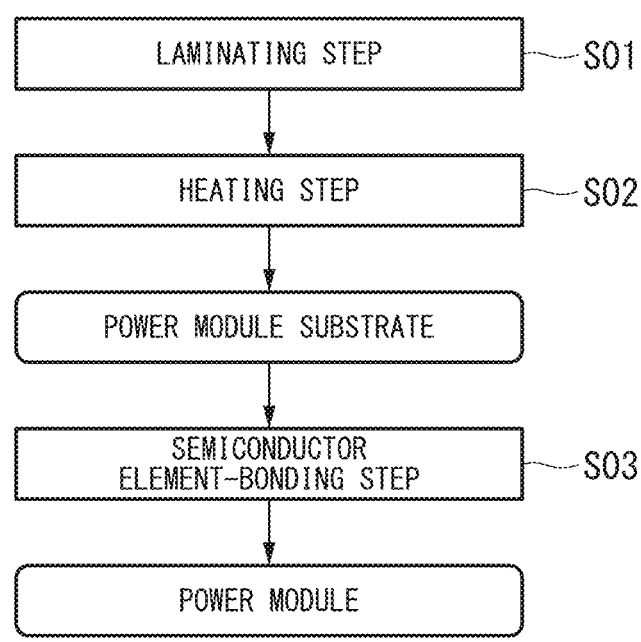
FIG. 4 is a flowchart showing a method of producing the power module substrate and the power module in the first embodiment of the present invention.

Hereinafter, a method of producing the power module substrate 10 and the power module 1 in the embodiment will be described with reference to the flowchart in FIG. 4, and FIG. 5.

First, as shown in FIG. 5, the Cu—P—Sn—Ni brazing filler material 24, the Ti foil 25, and the Cu foil 22 which forms into the circuit layer 12 are sequentially laminated on the first surface (an upper surface in FIG. 5) which is one surface of the ceramic substrate 11 (laminating step S01). That is, between the ceramic substrate 11 and the Cu foil 22, the Cu—P—Sn—Ni brazing filler material 24 is disposed close to the ceramic substrate 11, and the Ti foil 25 is disposed close to the Cu foil 22.

In the embodiment, the compositions of the Cu—P—Sn—Ni brazing filler material 24 are Cu, 7 mass % of P, 15 mass % of Sn, and 10 mass % of Ni.

The thickness of the Cu—P—Sn—Ni brazing filler material 24 is in a range of 5 μm to 150 μm. In the embodiment, the Cu—P—Sn—Ni brazing filler material with the thickness of 20 μm is used.

The Ti foil 25 has a thickness of 6 m to 25 μm and a purity of 99.4% or more. In the embodiment, Ti foil with a thickness of 10 μm and a purity of 99.8%.

Subsequently, the ceramic substrate 11, the Cu—P—Sn—Ni brazing filler material 24, the Ti foil 25, and the Cu foil 22 are placed into and heated in a vacuum heating furnace while being pressurized (at a pressure of 1 $kgf/cm^2$ to 35 $kgf/cm^2$ (0.10 MPa to 3.43 MPa)) in a laminating direction (heating step S02). In the embodiment, the internal pressure of the vacuum heating furnace is set to be in a range of $10^{-6}$ Pa to $10^{-3}$ Pa, the heating temperature is set to be in a range of 600° C. to 650° C., and the heating time is set to be in a range of 30 minutes to 360 minutes.

In the heating step S02, the Ti foil 25 and the Cu foil 22 are bonded through the diffusion in solids. Cu—P—Sn—Ni brazing filler material 24 is melted to form a liquid phase, the liquid phase is solidified, and thereby the ceramic substrate 11 and the Ti foil 25 are bonded to each other. At this time, the first intermetallic compound layer 16 made of Ti and Cu is formed at the bonded interface between the Cu foil 22 (the circuit layer 12) and the Ti foil 25 (the Ti layer 15). P and Ni contained in the Cu—P—Sn—Ni brazing filler material 24 are combined with Ti contained in the Ti foil 25, and thereby the second intermetallic compound layer 17 is formed. The Cu—Sn layer 14 not containing P and Ni or containing a very small amounts of P and Ni is formed close to the ceramic substrate 11.

As a result, the circuit layer 12 is formed on the first surface of the ceramic substrate 11 such that the power module substrate 10 in the embodiment is produced.

Subsequently, the semiconductor element 3 is bonded to the upper surface of the circuit layer 12 of the power module substrate 10 through the solder material (semiconductor element-bonding step S03).

As such, the power module 1 in the embodiment is produced.

In the power module substrate 10 with such a configuration according to the embodiment, at the bonded interface between the ceramic substrate 11 and the circuit layer 12, P and Ni contained in the Cu—P—Sn—Ni brazing filler material 24 are drawn into the second intermetallic compound layer 17 formed close to the Ti layer 15. Thereby, the Cu—Sn layer 14 without an intermetallic compound containing P and Ni or with a very small amount of an intermetallic compound containing P and Ni is formed close to the ceramic substrate 11. That is, since a rigid intermetallic compound is not formed in the vicinity of the ceramic substrate 11, it is possible to reduce thermal stress generating in the ceramic substrate 11 when the power module substrate 10 undergoes a thermal cycle. As a result, it is possible to limit the occurrence of cracking in the ceramic substrate 11. Further, since a brittle intermetallic compound is not formed in the vicinity of the ceramic substrate 11, it is possible to limit a decrease in the bonding rate between the ceramic substrate 11 and the circuit layer 12 when the power module substrate 10 undergoes a thermal cycle, and it is possible to improve the reliability of bonding.

The Ti layer 15 is formed between the Cu—Sn layer 14 and the circuit layer 12, and thus it is possible to prevent Sn from diffusing to the circuit layer 12. Therefore, when the circuit layer 12 is formed on the first surface of the ceramic substrate 11 using the Cu—P—Sn—Ni brazing filler material 24, it is possible to prevent a decrease in the Sn concentration in the Cu—P—Sn—Ni brazing filler material 24, and thus to limit an increase in the melting point of the Cu—P—Sn—Ni brazing filler material 24. That is, by limiting the increase in the melting point of the Cu—P—Sn—Ni brazing filler material 24, the bonding can be performed at comparatively low temperature, and thus it is possible to limit the thermal degradation of the ceramic substrate 11.

The thickness of the Ti layer 15 is preferably set to be 1 μm to 15 μm, and thus it is possible to reliably prevent Sn from diffusing to the circuit layer 12. In addition, in this case, the Ti layer with relatively high strength is thin. Therefore, thermal stress generating in the ceramic substrate 11 is reduced when the power module substrate 10 undergoes a thermal cycle, and it is possible to limit the occurrence of cracking in the ceramic substrate 11.

Since the first intermetallic compound layer 16 made of Cu and Ti is formed between the circuit layer 12 and the Ti layer 15, Cu in the circuit layer 12 sufficiently diffuses through the Ti layer 15 and Ti in the Ti layer 15 sufficiently diffuses through the circuit layer 12. Thus, the circuit layer 12 and the Ti layer 15 are bonded sufficiently.

The thickness of the first intermetallic compound layer 16 is set to be 0.5 μm to 10 μm. Thus, since Cu in the circuit layer 12 sufficiently diffuses through the Ti layer 15 and Ti in the Ti layer 15 sufficiently diffuses through the circuit layer 12, the sufficient bonding strength can be ensured. In addition to this, since the rigid first intermetallic compound layer 16 is thin, it is possible to reduce thermal stress generating in the ceramic substrate 11 when the power module substrate 10 undergoes a thermal cycle, and to limit the occurrence of cracking.

In the power module substrate 10 and the power module 1 according to the embodiment, the circuit layer 12 made of the Cu foil 22 is formed on the first surface which is one surface of the ceramic substrate 11, and thus it is possible to spread out heat from the semiconductor element 3, and to dissipate heat to the ceramic substrate 11. Since the Cu foil 22 has a relatively high resistance to deformation, when the power module substrate 10 undergoes a thermal cycle, it is possible to limit deformation of the circuit layer 12. As a result, it is possible to limit deformation of the bonding layer 2 bonding the semiconductor element 3 to the circuit layer 12, and it is possible to improve the reliability of bonding between the semiconductor element 3 and the circuit layer 12.

According to the method of producing the power module substrate 10 in the embodiment, since the ceramic substrate 11 and the Cu foil 22 is subjected to a heating process with the Cu—P—Sn—Ni brazing filler material 24 and the Ti foil 25 being interposed therebetween, during heating, Ti is melted into the liquid phase of the melted Cu—P—Sn—Ni brazing filler material 24, and wettability between the ceramic substrate 11 and the liquid phase of the Cu—P—Sn—Ni brazing filler material 24 is improved.

When the heating temperature is 600° C. or higher in the heating step S02, the Cu—P—Sn—Ni brazing filler material 24 can be reliably melted at the bonded interface between the ceramic substrate 11 and the Cu foil 22. In addition to this, the Ti foil 25 and the Cu foil 22 are bonded to each other through a sufficient diffusion in solids. Therefore, the ceramic substrate 11 and the Cu foil 22 can be reliably bonded to each other. When the heating temperature is 650° C. or less, it is possible to limit the thermal degradation of the ceramic substrate 11, and to reduce thermal stress generating in the ceramic substrate 11. For this reason, in the embodiment, the heating temperature is set to be in a range of 600° C. to 650° C.

When pressure applied to the ceramic substrate 11 and the like is 1 kgf/cm$^2$ (0.10 MPa) or greater in the heating step S02, since the ceramic substrate 11 is capable of coming into close contact with the liquid phase of the Cu—P—Sn—Ni brazing filler material 24, the ceramic substrate 11 and the Cu—Sn layer 14 can be sufficiently bonded to each other. When the pressure applied is 1 kgf/cm$^2$ or greater, the occurrence of a gap being generated between the Ti foil 25 and the Cu foil 22 can be limited, and the Ti foil 25 and the Cu foil 22 can be bonded to each other by diffusion in solids. For this reason, in the embodiment, the applied pressure is set to be in a range of 1 kgf/cm$^2$ to 35 kgf/cm$^2$ (0.10 MPa to 3.43 MPa).

When the heating time is 30 minutes or more in the heating step S02, since it is possible to ensure a sufficient amount of time required when P contained in the melted Cu—P—Sn—Ni brazing filler material 24 is combined with Ti contained in the Ti foil at the bonded interface between the ceramic substrate 11 and the Cu foil 22, the Cu—Sn layer can be reliably formed close to the ceramic substrate 11. Further, when the heating time is 30 minutes or more, the Ti foil 25 and the Cu foil 22 are bonded to each other by sufficient diffusion in solids. Therefore, the ceramic substrate 11 and the Cu foil 22 can be reliably bonded to each other. Even when the heating time exceeds 360 minutes, bondability between the ceramic substrate 11 and the circuit layer 12 is not improved compared to the case in which the heating time is 360 minutes. When the heating time exceeds 360 minutes, productivity is decreased. For this reason, in the embodiment, the heating time is set to be in a range of 30 minutes to 360 minutes.

In the embodiment, since the Cu—P—Sn—Ni brazing filler material 24 with a melting point of 580° C. is used, it is possible to form a liquid phase of the brazing filler material at a low temperature. In the embodiment, the solidus temperature of the Cu—P—Sn—Ni brazing filler material is used as a melting point.

As described above, Cu—P—Sn—Ni brazing filler material 24 is sufficiently bonded to ceramics substrate 11, and the Ti foil 25 and the Cu foil are bonded to each other by diffusion in solids. As a result, the ceramics substrate 11 and the Cu foil 22 are sufficiently bonded to each other, and it is possible to improve the reliability of bonding between the ceramic substrate 11 and the circuit layer 12.

Second Embodiment

Hereinafter, a second embodiment of the present invention will be described. The same reference signs will be assigned to the same configuration elements as in the first embodiment, and detailed descriptions thereof will be omitted.

Figure 6:
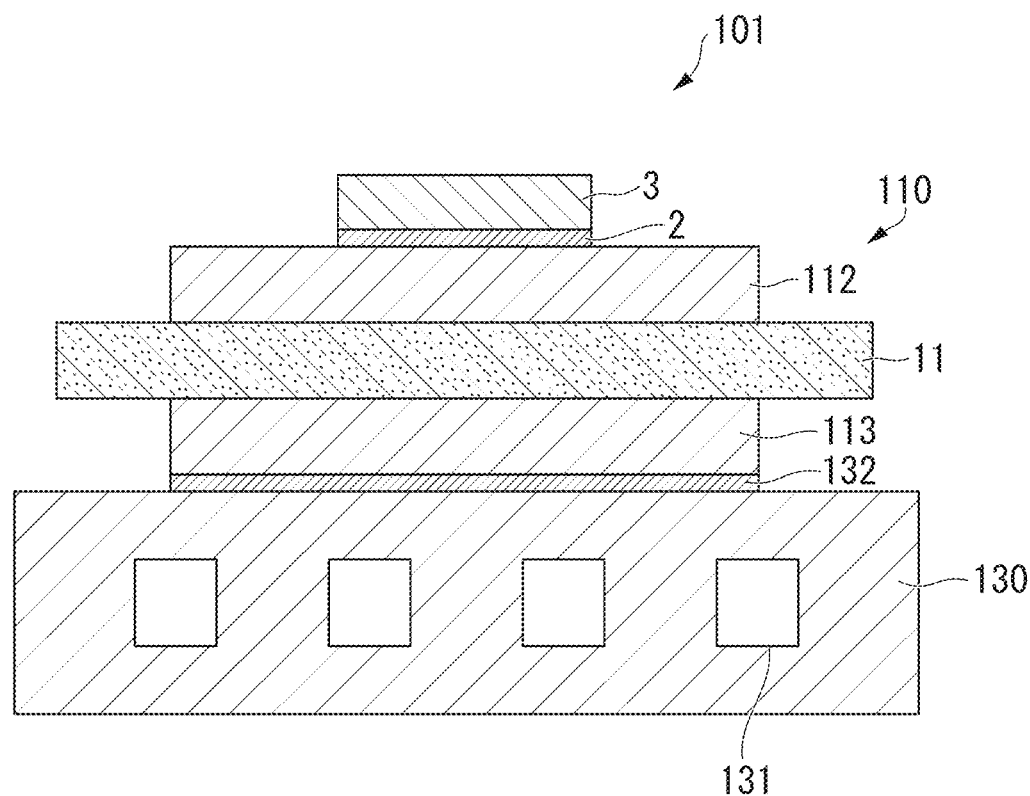
FIG. 6 is a schematic view of a power module in which a power module substrate is used in a second embodiment of the present invention.

FIG. 6 shows a power module 101 including a power module substrate 110 in the second embodiment.

The power module 101 includes: the power module substrate 110 in which a circuit layer 112 is provided on the first surface of the ceramic substrate 11; the semiconductor element 3 that is bonded to a surface at one side (an upper surface in FIG. 6) of the circuit layer 112 through the bonding layer 2; and a heat sink 130 disposed on the other side (a lower side in FIG. 6) of the power module substrate 110.

Figure 7:
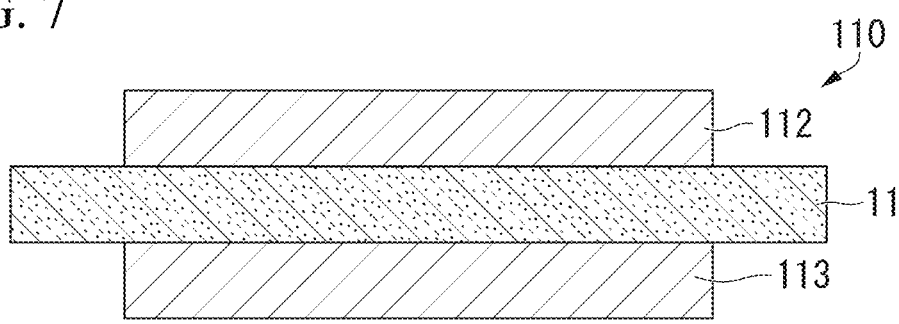
FIG. 7 is a schematic view of the power module substrate in the second embodiment of the present invention.

As shown in FIG. 7, the power module substrate 110 includes: the ceramic substrate 11; the circuit layer 112 provided on the first surface (an upper surface in FIG. 7) which is one surface of the ceramic substrate 11; and a metal layer 113 provided on the second surface (a lower surface in FIG. 7) which is the other surface of the ceramic substrate 11.

The ceramic substrate 11 is made of aluminum nitride (AlN) having good heat radiation.

Figure 10:
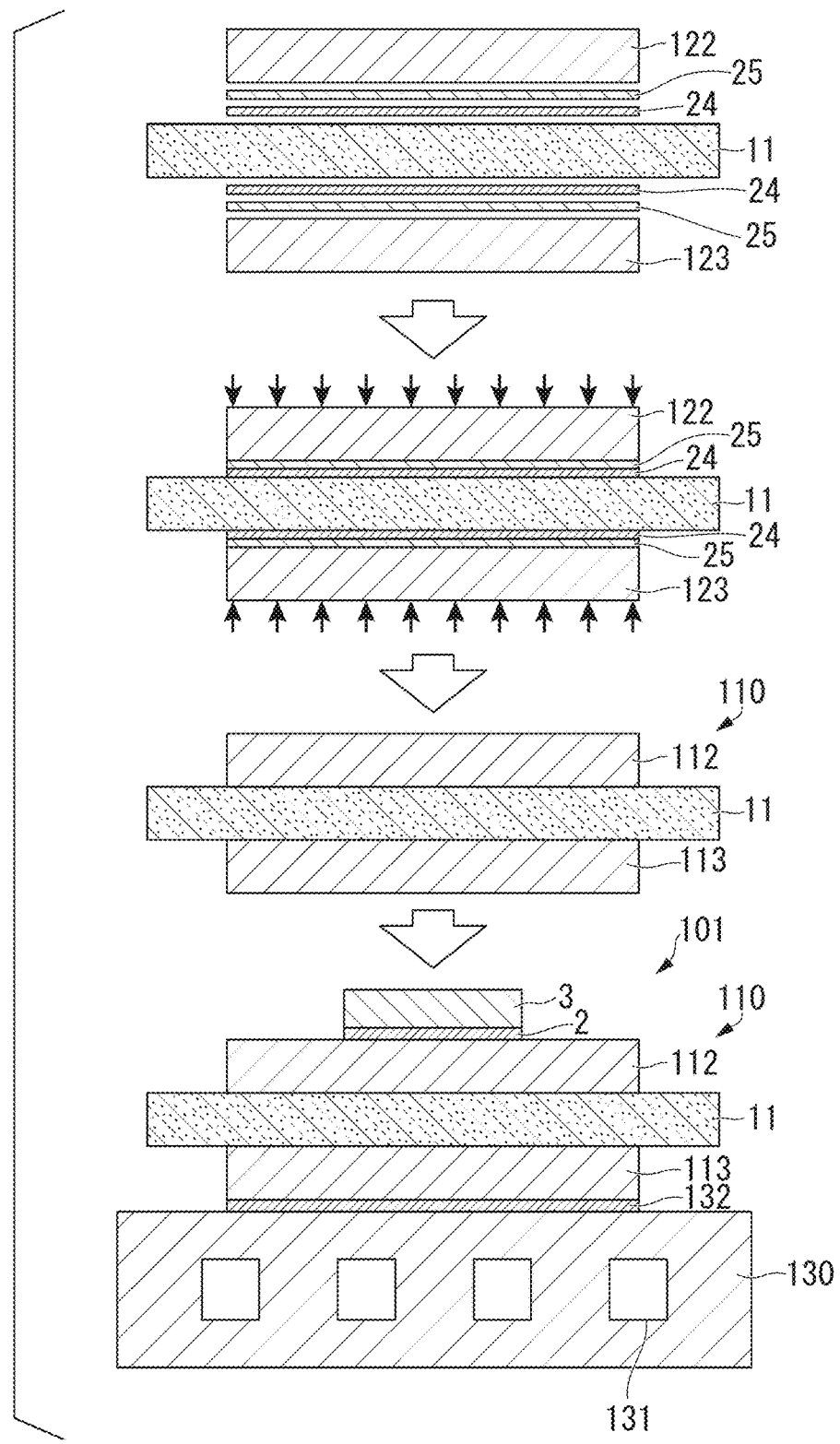
FIG. 10 shows schematic views showing the method of producing the power module substrate and the power module in the second embodiment of the present invention.

Similar to the first embodiment, the circuit layer 112 is formed by bonding a Cu foil 122 to the ceramic substrate 11 through the heating of the Cu—P—Sn—Ni brazing filler material 24, Ti foil 25 as the Ti material, and the Cu foil 122 made of oxygen-free copper, which are sequentially laminated on the first surface of the ceramic substrate 11 (refer to FIG. 10).

The thickness of the circuit layer 112 is set to be in a range of 0.1 mm to 1.0 mm. In the second embodiment, the thickness is set to 0.6 mm.

Similar to the first embodiment, the Cu—Sn layer (a first Cu—Sn layer) 14 and the Ti layer (a first Ti layer) 15 are formed at the bonded interface between the ceramic substrate 11 and the circuit layer 112. The Cu—Sn layer 14 is positioned close to the ceramic substrate 11. The Ti layer 15 is positioned between the circuit layer 112 and the Cu—Sn layer 14. Further, a first intermetallic compound layer 16 made of Cu and Ti is formed between the circuit layer 112 and the Ti layer 15. A second intermetallic compound layer 17 containing P and Ni is formed between the Cu—Sn layer 14 and the Ti layer 15.

The metal layer 113 is formed by bonding a metal plate made of Cu or a Cu alloy to the second surface which is the other surface of the ceramic substrate 11 through a Cu—P—Sn-based brazing filler material. In the second embodiment, the metal layer 113 is formed by bonding the Cu foil 123 to the ceramic substrate 11 through the heating of the Cu—P—Sn—Ni brazing filler material 24, Ti foil 25 as the Ti material, and the Cu foil 123 made of oxygen-free copper, which are sequentially laminated on the second surface of the ceramic substrate 11 (refer to FIG. 10).

The thickness of the metal layer 113 is set to be in a range of 0.1 mm to 1.0 mm. In the embodiment, the thickness is set to 0.6 mm.

Figure 8:
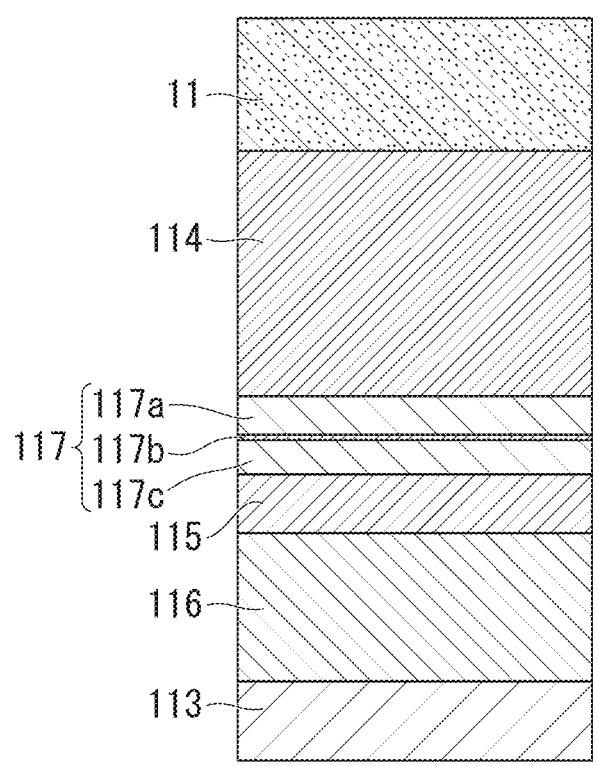
FIG. 8 is a schematic view of the section of the bonded interface between a metal layer and a ceramic substrate shown in FIG. 7.

FIG. 8 shows a schematic view of the bonded interface between the ceramic substrate 11 and the metal layer 113. As shown in FIG. 8, a Cu—Sn layer (a second Cu—Sn layer) 114 and a Ti layer (a second Ti layer) 115 are formed at the bonded interface between the ceramic substrate 11 and the metal layer 113. The Cu—Sn layer 114 is positioned close to the ceramic substrate 11. The Ti layer 115 is positioned between the metal layer 113 and the Cu—Sn layer 114. A first intermetallic compound layer (a third intermetallic compound layer) 116 made of Cu and Ti is formed between the metal layer 113 and the Ti layer 115. A second intermetallic compound layer (a fourth intermetallic compound layer) 117 containing P and Ni is formed between the Cu—Sn layer 114 and the Ti layer 115. The second intermetallic compound layer 117 has a P—Ni—Ti layer 117a, a P—Ti layer 117b, and a Cu—Ni—Ti layer 117c which are formed in this order from the Cu—Sn layer 114.

That is, the Cu—Sn layer (the second Cu—Sn layer) 114 has substantially the same structure as that of the Cu—Sn layer (the first Cu—Sn layer) 14, the Ti layer (the second Ti layer) 115 has a substantially the same structure as that of the Ti layer (the first Ti layer) 15, the first intermetallic compound layer (the third intermetallic compound layer) 116 has substantially the same structure as that of the first intermetallic compound layer 16, and the second intermetallic compound layer (the fourth intermetallic compound layer) 117 has substantially the same structure as that of the second intermetallic compound layer 17. The bonded interface between the ceramic substrate 11 and the metal layer 113 has the same structure as that of the bonded interface between the ceramic substrate 11 and the circuit layer 112.

The heat sink 130 dissipates heat from the power module substrate 110. The heat sink 130 is made of Cu or a Cu alloy. In the embodiment, the heat sink 130 is made of oxygen-free copper. The heat sink 130 is provided with flow passages 131 through which a coolant flows. In the embodiment, the heat sink 130 and the metal layer 113 are bonded to each other through a solder layer 132 made of a solder material.

Figure 9:
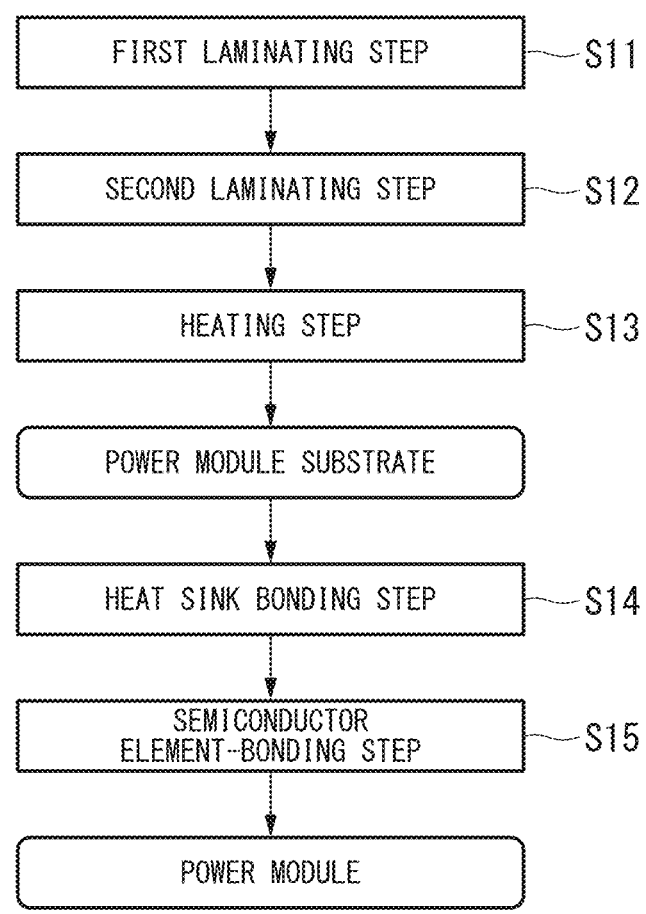
FIG. 9 is a flowchart showing a method of producing the power module substrate and the power module in the second embodiment of the present invention.

Hereinafter, a method of producing the power module 101 in the embodiment will be described with reference to the flowchart in FIG. 9, and FIG. 10.

First, as shown in FIG. 10, the Cu—P—Sn—Ni brazing filler material 24, the Ti foil 25, and the Cu foil 122 which forms into the circuit layer 112 are sequentially laminated on the first surface (an upper surface in FIG. 10) of the ceramic substrate 11 (a first laminating step S11). The Cu—P—Sn—Ni brazing filler material 24, the Ti foil 25, and the Cu foil 123 which forms into the metal layer 113 are sequentially laminated on the second surface (a lower surface in FIG. 10) of the ceramic substrate 11 (a second laminating step S12).

That is, the Cu—P—Sn—Ni brazing filler material 24 is disposed close to the ceramic substrate 11, and the Ti foil 25 is disposed close to each of the Cu foils 122, 123 between the ceramic substrate 11 and each of the Cu foils 122, 123. The thickness of the Ti foil 25 is set to be in a range of 6 μm to 25 μm, and in the embodiment, the Ti foil 25 with a thickness of 8 μm is used.

Subsequently, the ceramic substrate 11, the Cu—P—Sn—Ni brazing filler material 24, the Ti foil 25, and the Cu foils 122 and 123 are placed into and heated in a vacuum heating furnace while being pressurized (at a pressure of 1 kgf/cm² to 35 kgf/cm² (0.10 MPa to 3.43 MPa)) in a laminating direction (heating step S13). In the second embodiment, the internal pressure of the vacuum heating furnace is set to be in a range of $10^{-6}$ Pa to $10^{-3}$ Pa, the heating temperature is set to be in a range of 600° C. to 650° C., and the heating time is set to be in a range of 30 minutes to 360 minutes.

In the heating step S13, the Ti foil 25 and the Cu foil 122, 123 are bonded to each other through diffusion in solids. Further, the Cu—P—Sn—Ni brazing filler material 24 is melted to form a liquid phase, and the liquid phase is solidified. Thereby, the ceramic substrate 11 and the Ti foil 25 are bonded to each other through the Cu—P—Sn—Ni brazing filler material 24.

Accordingly, the circuit layer 112 and the metal layer 113 are respectively formed on the first surface and the second surface of the ceramic substrate 11, and thereby the power module substrate 110 in the embodiment is produced.

Subsequently, the heat sink 130 is bonded to a lower surface of the metal layer 113 of the power module substrate 110 through a solder material (heat sink bonding step S14).

Subsequently, the semiconductor element 3 is bonded to the upper surface of the circuit layer 112 of the power module substrate 110 through a solder material (semiconductor element-bonding step S15).

As such, the power module 101 in the embodiment is produced.

The power module substrate 110 with such a configuration according to the second embodiment provides the same effects as the power module substrate 10 in the first embodiment.

The metal layer 113 made of the Cu foil 123 is formed on the second surface of the ceramic substrate 11, and thus the power module substrate 110 is capable of efficiently dissipating heat from the semiconductor element 3 through the metal layer 113.

Similar to the bonded interface between the ceramic substrate 11 and the circuit layer 112, at the bonded interface between the ceramic substrate 11 and the metal layer 113, the Cu—Sn layer 114, in which Sn forms a solid solution with Cu, is formed closed to the ceramic substrate 11, and a rigid intermetallic compound is not formed in the vicinity of the ceramic substrate 11. For this reason, when the power module substrate 110 undergoes a thermal cycle, it is possible to reduce thermal stress generating in the ceramic substrate 11 and to limit the occurrence of cracking in the ceramic substrate 11. Further, since a brittle intermetallic compound layer is not formed in the vicinity of the ceramic substrate 11, it is possible to limit a decrease in the bonding rate between the ceramic substrate 11 and the metal layer 113 when the power module substrate 110 undergoes a thermal cycle, and it is possible to improve the reliability of bonding.

Since the heat sink 130 is bonded to the metal layer 113, the power module substrate 110 in the second embodiment is capable of efficiently dissipating heat through the heat sink 130.

According to the method of producing the power module substrate 110 in the second embodiment, the circuit layer 112 and the metal layer 113 are respectively bonded to the first surface which is one surface of the ceramic substrate 11 and the second surface which is the other surface of the ceramic substrate 11, simultaneously. As a result, it is possible to simplify a producing process, and to reduce production costs.

Third Embodiment

Hereinafter, a third embodiment of the present invention will be described. The same reference signs will be assigned to the same configuration elements as in the first embodiment, and detailed descriptions thereof will be omitted.

Figure 11:
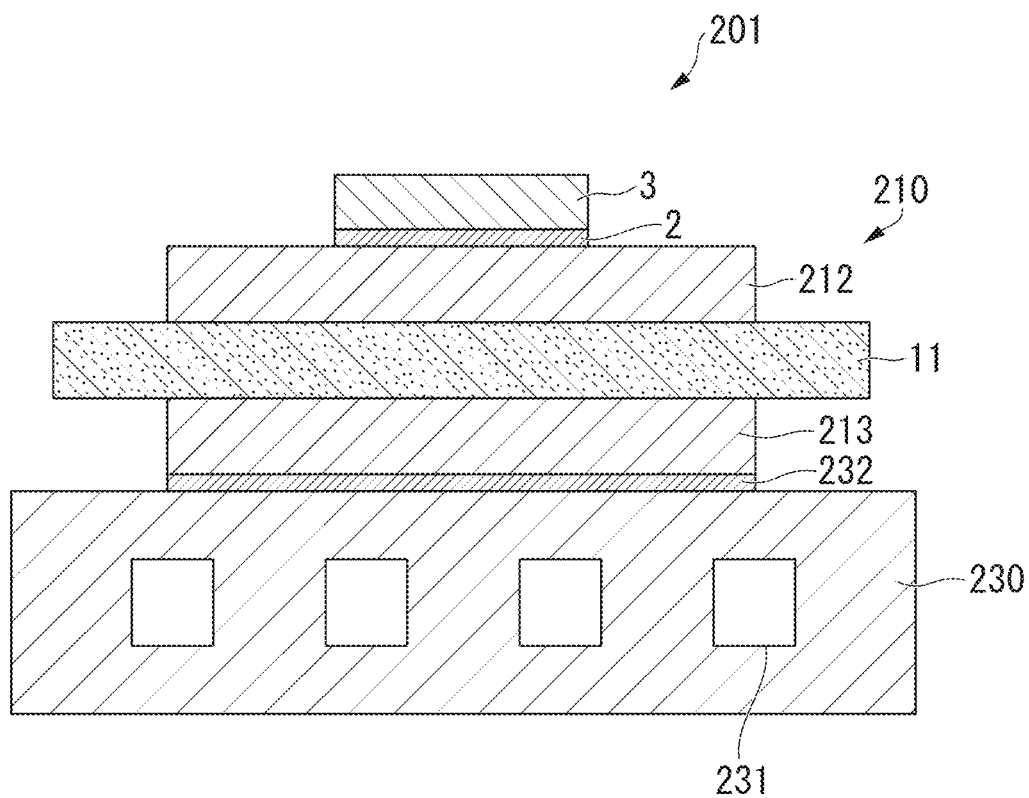
FIG. 11 is a schematic view of a power module in which a power module substrate in a third embodiment of the present invention is used.

FIG. 11 shows a power module 201 including a power module substrate 210 in the third embodiment.

The power module 201 includes: the power module substrate 210 in which a circuit layer 212 is provided on the first surface of the ceramic substrate 11; the semiconductor element 3 that is bonded to a surface at one side (an upper surface in FIG. 11) of the circuit layer 212 through the bonding layer 2; and a heat sink 230 bonded to the other side (a lower side in FIG. 11) of the power module substrate 210 through a bonding layer 232.

Figure 12:
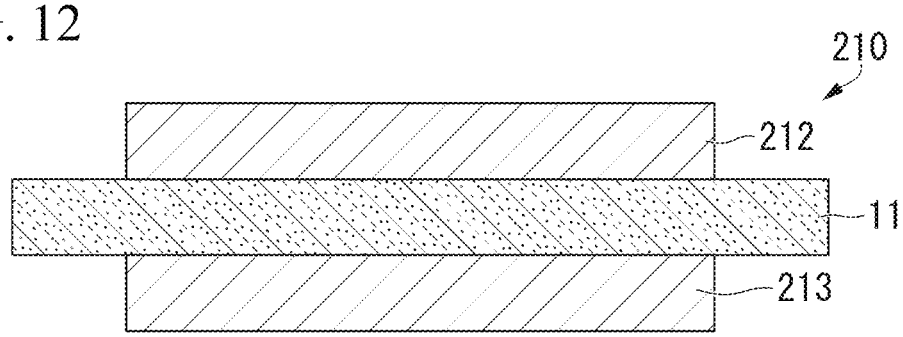
FIG. 12 is a schematic view of the power module substrate in the third embodiment of the present invention.

As shown in FIG. 12, the power module substrate 210 includes: the ceramic substrate 11; the circuit layer 212 provided on the first surface (an upper surface in FIG. 12) which is one surface of the ceramic substrate 11; and a metal layer 213 provided on the second surface (a lower surface in FIG. 12) which is the other surface of the ceramic substrate 11.

The ceramic substrate 11 is made of aluminum nitride (AlN) having good heat radiation.

Figure 14:
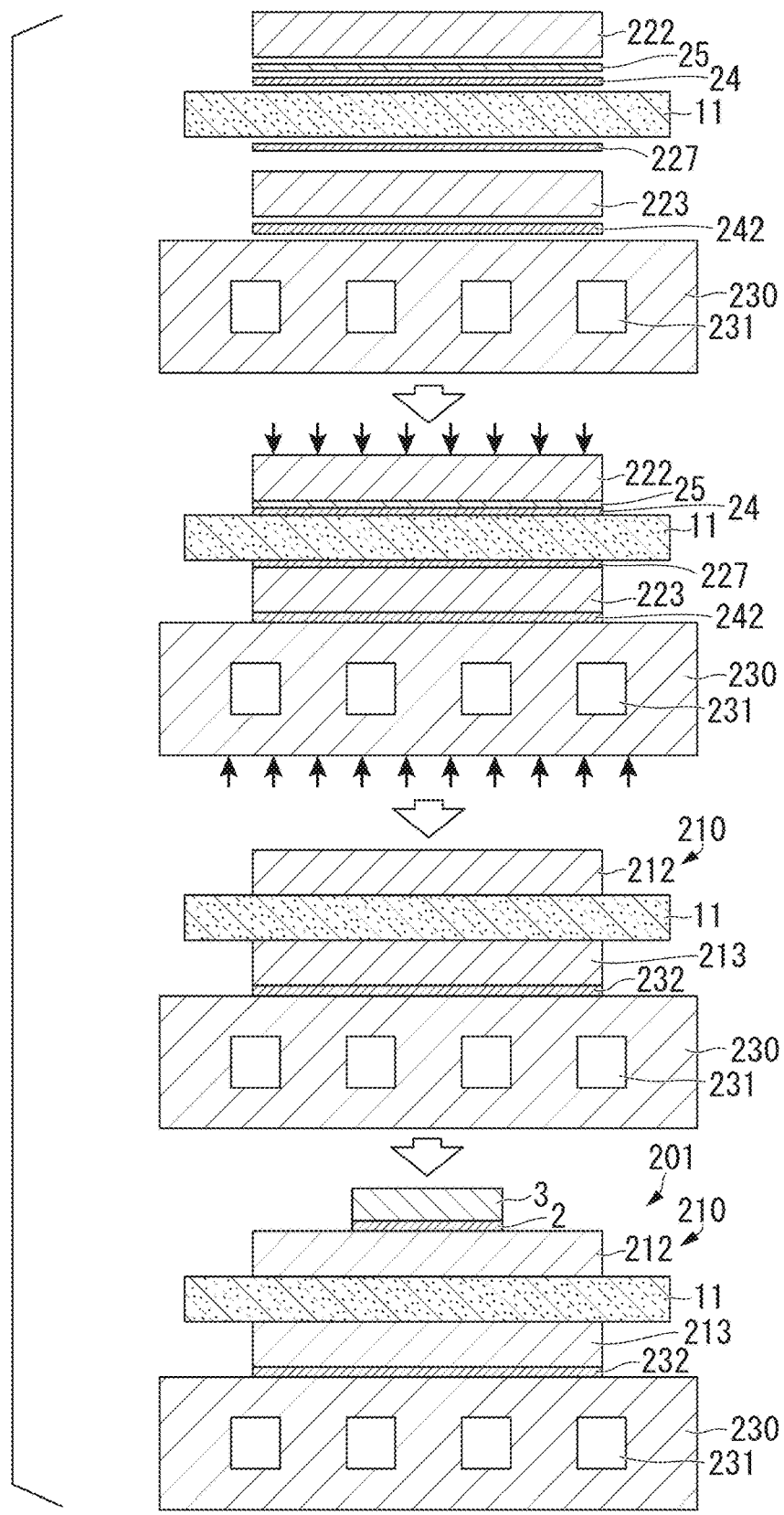
FIG. 14 shows schematic views showing the method of producing the power module substrate and the power module in the third embodiment of the present invention.

Similar to the first embodiment, the circuit layer 212 is formed by bonding a Cu foil 222 to the ceramic substrate 11 through the heating of the Cu—P—Sn—Ni brazing filler material 24, Ti foil 25 as the Ti material, and the Cu foil 222 made of oxygen-free copper, which are sequentially laminated on the first surface of the ceramic substrate 11 (refer to FIG. 14).

The thickness of the circuit layer 212 is set to be in a range of 0.1 mm to 1.0 mm. In the third embodiment, the thickness is set to 0.6 mm.

Similar to the first embodiment, the Cu—Sn layer 14 and the Ti layer 15 are formed at the bonded interface between the ceramic substrate 11 and the circuit layer 212. The Cu—Sn layer 14 is positioned close to the ceramic substrate 11. The Ti layer 15 is positioned between the circuit layer 212 and the Cu—Sn layer 14. Further, the first intermetallic compound layer 16 made of Cu and Ti is formed between the circuit layer 212 and the Ti layer 15. A second intermetallic compound layer 17 containing P and Ni is formed between the Cu—Sn layer 14 and the Ti layer 15.

The metal layer 213 is formed by bonding a metal plate made of Al or an Al alloy to the second surface which is the other surface of the ceramic substrate 11 through a bonding material 227. In the third embodiment, the metal layer 213 is formed by bonding an Al plate 223 with a purity of 99.99 mass % or more to the second surface of the ceramic substrate 11 (refer to FIG. 14).

The thickness of the metal layer 213 is set to be in a range of 0.1 mm to 3.0 mm. In the embodiment, the thickness is set to 1.6 mm.

The heat sink 230 is made of Al or an Al alloy. In the embodiment, the heat sink 230 is made of A6063 (Al alloy). The heat sink 230 is provided with flow passages 231 through which a coolant flows. The heat sink 230 and the metal layer 213 are bonded to each other through an Al—Si-based brazing filler material.

Figure 13:
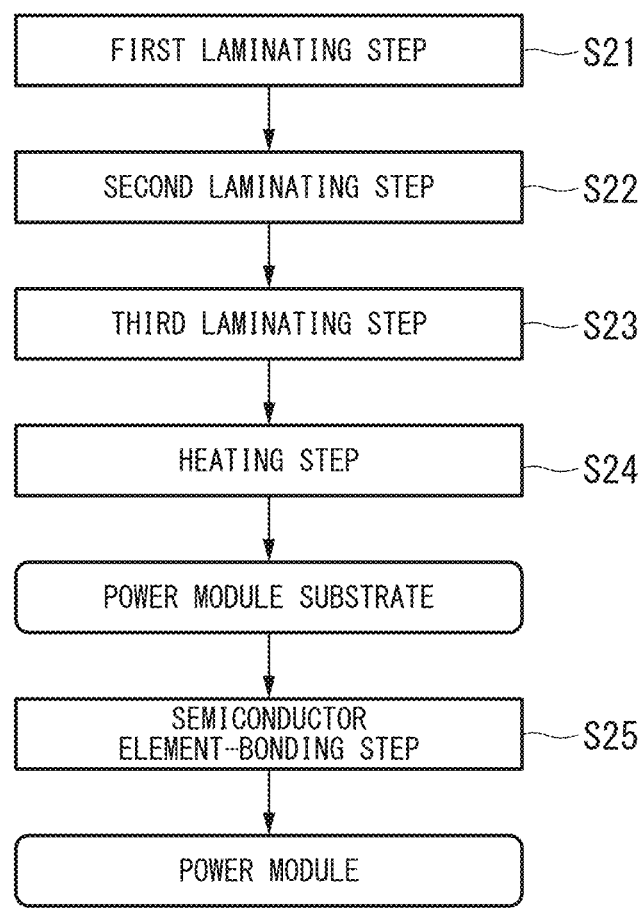
FIG. 13 is a flowchart showing a method of producing the power module substrate and the power module in the third embodiment of the present invention.

Hereinafter, a method of producing the power module 201 in the embodiment will be described with reference to the flowchart in FIG. 13, and FIG. 14.

First, as shown in FIG. 14, the Cu—P—Sn—Ni brazing filler material 24, the Ti foil 25, and the Cu foil 222 which forms into the circuit layer 212 are sequentially laminated on the first surface (an upper surface in FIG. 14) of the ceramic substrate 11 (a first laminating step S21). The Al plate 223 which forms into the metal layer 213 is laminated on the second surface (a lower surface in FIG. 14) of the ceramic substrate 11 with the bonding material 227 interposed between the Al plate 223 and the ceramic substrate 11 (a second laminating step S22). The heat sink 230 is laminated on a lower side of the Al plate 223 with a bonding material 242 interposed between the heat sink 230 and the Al plate 223 (a third laminating step S23).

In the embodiment, the bonding materials 227 and 242 are Al—Si-based brazing filler materials containing Si which lowers a melting point. In the third embodiment, an Al—Si (7.5 mass %) brazing filler material is used.

The thickness of the Ti foil 25 is set to be in a range of 6 μm to 25 μm, and in the embodiment, the Ti foil 25 with a thickness of 12 μm is used.

Subsequently, the ceramic substrate 11, the Cu—P—Sn—Ni brazing filler material 24, the Ti foil 25, the Cu foil 222, the bonding material 227, the Al plate 223, the bonding material 242, and the heat sink 230 are placed into and heated in a vacuum heating furnace while being pressurized (at a pressure of 1 kgf/cm$^2$ to 35 kgf/cm$^2$ (0.10 MPa to 3.43 MPa)) in a laminating direction (heating step S24). In the third embodiment, the internal pressure of the vacuum heating furnace is set to be in a range of $10^{-6}$ Pa to $10^{-3}$ Pa, the heating temperature is set to be in a range of 600° C. to 650° C., and the heating time is set to be in a range of 30 minutes to 360 minutes.

In the heating step S24, the Ti foil 25 and the Cu foil 222 are bonded to each other by diffusion in solids. Further, the Cu—P—Sn—Ni brazing filler material 24 is melted to form a liquid phase, and the liquid phase is solidified. Thereby, the ceramic substrate 11 and the Ti foil 25 are bonded to each other. In the heating step S24, the bonding material 227 is melted to form a liquid phase, and the liquid phase is solidified. Thereby, the ceramic substrate 11 and the Al plate 223 are bonded to each other through the bonding material 227. In the heating step S24, the bonding material 242 is melted to form a liquid phase, and the liquid phase is solidified. Thereby, the Al plate 223 and the heat sink 230 are bonded to each other through the bonding material 242.

Accordingly, the power module substrate 210 in the third embodiment is produced.

Subsequently, the semiconductor element 3 is bonded to the upper surface of the circuit layer 212 of the power module substrate 210 through a solder material (semiconductor element-bonding step S25).

As such, the power module 201 in the third embodiment is produced.

The power module substrate 210 with such a configuration according to the third embodiment provides the same effects as the power module substrate 10 in the first embodiment.

The Al plate 223 is bonded to the second surface of the ceramic substrate 11 such that the metal layer 213 is formed, and thus the power module substrate 210 in the third embodiment is capable of efficiently dissipating heat from the semiconductor element 3 through the metal layer 213. Since Al has a relatively low resistance to deformation, when the power module substrate 210 undergoes a thermal cycle, the metal layer 213 is capable of absorbing thermal stress occurring between the power module substrate 210 and the heat sink 230. As a result, it is possible to limit the occurrence of cracking in the ceramic substrate 11.

According to the method of producing the power module substrate 210 in the third embodiment, the circuit layer 212 and the metal layer 213 are respectively bonded to the first surface and the second surface of the ceramic substrate 11 simultaneously. At this time, the heat sink 230 is also bonded to the metal layer 213 simultaneously. As a result, it is possible to simplify a producing process, and to reduce producing costs.

The embodiments of the present invention have been described; however, the present invention is not limited to the embodiments, and modifications can be appropriately made to the embodiments insofar as the modifications do not depart from the technical spirit of the invention.

In the second and third embodiments, the circuit layer and the metal layer are respectively bonded to the first surface and the second surface of the ceramic substrate simultaneously; however, the circuit layer and the metal layer may be independently bonded to the respective surfaces of the ceramic substrate.

In the third embodiment, the bonding of the circuit layer, the metal layer, and the heat sink is performed simultaneously; however, after the circuit layer and the metal layer are bonded to the ceramic substrate, the metal layer and the heat sink may be bonded to each other.

In the third embodiment, the metal layer is bonded to the second surface of the ceramic substrate through an Al—Si-based brazing filler material; however, the metal layer may be bonded to the second surface of the ceramic substrate by a transient liquid phase (TLP) bonding method, an Ag paste, or the like.

In the second and third embodiments, the heat sink with the flow passages are used; however, a plate-like heat sink called a heat radiation plate, or a heat sink with pin-like tins may be used. The power module substrate and the heat sink are bonded to each other through a solder material or a brazing filler material; however, grease may be applied between the power module substrate and the heat sink, and the power module substrate and the heat sink may be fixed together with screws. In the power module substrates according to the second and third embodiments, the heat sink may not be bonded to the other surface of the power module substrate (the second surface of the ceramic substrate).

In the above-described embodiments, Ti foil is used as a Ti material; however, it is possible to use a Cu member/Ti clad material in which Ti is provided on one surface of a Cu member. Alternately, the Cu member on which Ti is disposed by vapor deposition or the like, may be used.

In addition, it is possible to use a Ti material/brazing clad material in which a Cu—P—Sn-based brazing filler material is provided on one surface of a Ti material, or a Cu member/Ti material/brazing clad material in which a Cu member, a Ti material, and a Cu—P—Sn-based brazing filler material are sequentially laminated.

In the above-described embodiments, Ti foil is used as a Ti material; however, the present invention is not limited to this configuration, and hydrogenated titanium may be used as the Ti material.

EXAMPLES

Example 1

Hereinafter, results of confirmation tests (Example 1) performed to confirm the effects of the embodiments of the present invention will be described.

Sheets of Cu—P—Sn-based brazing filler foil (37 mm×37 mm) with thicknesses shown in Table 1; Ti foils (37 mm×37 mm) with thicknesses shown in Table 1; and Cu foils (37 mm×37 mm×0.3 mm thickness) made of oxygen-free copper were sequentially laminated on first surfaces of ceramic substrates (40 mm×40 mm) shown in Table 1. When the material of the ceramic substrate was AlN, the thickness of the ceramic substrate was set to 0.635 mm, and when the material was $Si_3N_4$, the thickness was set to 0.32 mm.

While being pressurized at a pressure of 15 kgf/cm² (1.47 MPa) in a laminating direction, the ceramic substrate, the Cu—P—Sn-based brazing filler material, the Ti foil, and the Cu foil, which were laminated, were placed into and heated in a vacuum heating furnace. Thereby, the Cu foil was bonded to the first surface of the ceramic substrate, and a circuit layer was formed. The internal pressure of the vacuum heating furnace was set to be in a range of $10^{-6}$ Pa to $10^{-3}$ Pa, and the heating temperature and the heating time were set to the conditions shown in Table 1. As such, the power module substrates in Examples 1-1 to 1-13 of the present invention were obtained.

A power module substrate in Comparative Example 1 was obtained in the following manner. Cu—P—Sn-based brazing filler foils (37 mm×37 mm) with thicknesses shown in Table 1 and Cu foils (37 mm×37 mm×0.3 mm thickness) made of oxygen-free copper were sequentially laminated on first surfaces of ceramic substrates (40 mm×40 mm×0.635 mm thickness) made of AlN. While being pressurized at a pressure of 15 kgf/cm² (1.47 MPa) in a laminating direction, the ceramic substrate, the Cu—P—Sn-based brazing filler material, and the Cu foil, which were laminated, were placed into and heated in a vacuum heating furnace. Thereby, the Cu foil was bonded to the first surface of the ceramic substrate, and a circuit layer was formed.

That is, in the power module substrate of Comparative Example 1, the ceramic substrate and the Cu foil were bonded to each other without a Ti foil being interposed therebetween.

In each of the power module substrates obtained in the aforementioned manner, the initial bonding rate between the circuit layer and the ceramic substrate was evaluated. A method of evaluating the bonding rate will be described below.

In each of the obtained power module substrates, the thicknesses of the Ti layer and the first intermetallic compound layer were measured at the bonded interface between the ceramic substrate and the circuit layer. A method of measuring the thickness of the Ti layer and the first intermetallic compound layer will be described below.

(Evaluation of Bonding Rate)

In the power module substrate, the bonding rate of the interface between the ceramic substrate and the circuit layer was evaluated by an ultrasonic flaw detector (FineSAT200 manufactured by Hitachi Power Solutions), and was calculated by the following expression.

An initial bonding area was an area before bonding, which has to be bonded. In the examples, the initial bonding area was the area (37 mm×37 mm) of the circuit layer. Exfoliation in an image obtained by binarizing an ultrasonic-detected image was shown by a white portion in a bonding portion, and thus the area of the white portion was deemed to be an exfoliation area.

(Bonding Rate (%))=((Initial Bonding Area)−(Exfoliation Area))/(Initial Bonding Area)×100

(Method of Measuring Thicknesses of Ti Layer and First Intermetallic Compound Layer)

The thicknesses of the Ti layer and the first intermetallic compound layer were measured by the following method. A backscattered electron image of interface between the Cu foil and the Ti layer (in section in parallel with the laminating direction) was obtained using Electron Micro Analyzer (EPMA) (JXA-8530F manufactured by JEOL). In a visual field with magnification of 3,000-fold (30 μm vertical (in the laminating direction)×40 μm horizontal), area of the Ti layer and total area of the first intermetallic compound layer ($Cu_4Ti$, $Cu_3Ti_2$, $Cu_4Ti_3$, $CuTi$, $CuTi_2$) formed at the bonded interface were measured. Each of the area of the Ti layer and the total area of the first intermetallic compound layer was divided by the horizontal length (40 μm) of the visual field. Thereby, the thicknesses of the Ti layer and the first intermetallic compound layer in the visual field were obtained. The averages of the thicknesses of the Ti layer and the first intermetallic compound layer obtained in five visual fields is determined as the thicknesses of the Ti layer and the first intermetallic compound layer, respectively.

Results of the aforementioned evaluations were shown in Table 1.

TABLE 1

| Components of Cu—P—Sn-based Brazing Filler Material | Thickness of Cu—P—Sn-based Brazing Filler Material μm | Melting Point of Cu—P—Sn-based Brazing Filler Material | Thickness of Ti Foil μm | Material of Ceramic Substrate | Heating Conditions Temperature | Heating Conditions Time | Thickness of Ti Layer μm | Thickness of First Intermetallic Compound Layer μm | Initial Bonding Rate % |
|---|---|---|---|---|---|---|---|---|---|
| Example 1-1 | Cu-6.3 mass % of P-9.3 mass % of Sn-7 mass % of Ni | 20 | 600° C. | 9 | AlN | 650° C. | 90 min. | 3 | 5 | 99.1 |
| Example 1-2 | Cu-7 mass % of P-15 mass % of Sn-10 mass % of Ni | 20 | 580° C. | 8 | AlN | 650° C. | 90 min. | 1 | 5 | 99.6 |
| Example 1-3 | Cu-7 mass % of P-15 mass % of Sn-10 mass % of Ni | 20 | 580° C. | 20 | AlN | 650° C. | 90 min. | 15 | 5 | 98.6 |
| Example 1-4 | Cu-7 mass % of P-15 mass % of Sn-10 mass % of Ni | 20 | 580° C. | 15 | AlN | 630° C. | 30 min. | 8 | 0.5 | 97.2 |

TABLE 1-continued

| | Components of Cu—P—Sn-based Brazing Filler Material | Thickness of Cu—P—Sn-based Brazing Filler Material μm | Melting Point of Cu—P—Sn-based Brazing Filler Material | Thickness of Ti Foil μm | Material of Ceramic Substrate | Heating Conditions Temperature | Time | Thickness of Ti Layer μm | Thickness of First Intermetallic Compound Layer μm | Initial Bonding Rate % |
|---|---|---|---|---|---|---|---|---|---|---|
| Example 1-5 | Cu-7 mass % of P-15 mass % of Sn-10 mass % of Ni | 20 | 580° C. | 10 | AlN | 650° C. | 300 min. | 4 | 10 | 100.0 |
| Example 1-6 | Cu-7 mass % of P-15 mass % of Sn-10 mass % of Ni | 20 | 580° C. | 6 | AlN | 630° C. | 120 min. | 0.5 | 4 | 96.3 |
| Example 1-7 | Cu-7 mass % of P-15 mass % of Sn-10 mass % of Ni | 20 | 580° C. | 20 | AlN | 600° C. | 120 min. | 18 | 2 | 94.1 |
| Example 1-8 | Cu-7 mass % of P-15 mass % of Sn-10 mass % of Ni | 20 | 580° C. | 12 | AlN | 600° C. | 30 min. | 7 | 0.3 | 92.4 |
| Example 1-9 | Cu-7 mass % of P-15 mass % of Sn-10 mass % of Ni | 20 | 580° C. | 10 | AlN | 650° C. | 360 min. | 2 | 12 | 97.8 |
| Example 1-10 | Cu-6.3 mass % of P-9.3 mass % of Sn-7 mass % of Ni | 20 | 600° C. | 9 | $Si_3N_4$ | 650° C. | 90 min. | 3 | 5 | 96.8 |
| Example 1-11 | Cu-7 mass % of P-15 mass % of Sn-10 mass % of Ni | 20 | 580° C. | 8 | $Si_3N_4$ | 650° C. | 90 min. | 1 | 5 | 97.0 |
| Example 1-12 | Cu-7 mass % of P-15 mass % of Sn-5 mass % of Mn | 20 | 580° C. | 8 | AlN | 650° C. | 90 min. | 1 | 5 | 98.2 |
| Example 1-13 | Cu-7 mass % of P-15 mass % of Sn-7 mass % of Cr | 20 | 580° C. | 8 | AlN | 650° C. | 90 min. | 1 | 5 | 98.8 |
| Comparative Example 1 | Cu-7 mass % of P-15 mass % of Sn-10 mass % of Ni | 20 | 580° C. | — | AlN | 650° C. | 90 min. | — | — | 0.0 |

As shown in Table 1, in Examples 1-1 to 1-13 of the present invention, the ceramic substrate and the Cu foil were bonded together with the Cu—P—Sn-based brazing filler material and the Ti foil being interposed therebetween, and thus it was confirmed that the initial bonding rate between the ceramic substrate and the circuit layer was high, and the ceramic substrate and the circuit layer were sufficiently bonded to each other.

In contrast, in Comparative Example 1, the ceramic substrate and the Cu foil were bonded to each other without the Ti foil being interposed therebetween, and thus the ceramic substrate and the Cu foil (circuit layer) could not be bonded together.

Example 2

Hereinafter, results of confirmation tests (Example 2) performed to confirm the effects of the embodiments of the present invention will be described.

Sheets of Cu—P—Sn-based brazing filler foil (37 mm×37 mm) with thicknesses shown in Table 2; Ti foils (37 mm×37 mm) with thicknesses shown in Table 2; and Cu foils (37 mm×37 mm×0.3 mm thickness) made of oxygen-free copper were sequentially laminated on first surfaces and second surfaces of ceramic substrates (40 mm×40 mm) shown in Table 2. When the material of the ceramic substrate was AlN, the thickness of the ceramic substrate was set to 0.635 mm, and when the material was $Si_3N_4$, the thickness was set to 0.32 mm.

While being pressurized at a pressure of 15 kgf/cm² (1.47 MPa) in a laminating direction, the ceramic substrate, the Cu—P—Sn-based brazing filler material, the Ti foil, and the Cu foil, which were laminated, were placed into and heated in a vacuum heating furnace. Thereby, the Cu foils were respectively bonded to the first surface and the second surface of the ceramic substrate, and a circuit layer and a metal layer were formed. The internal pressure of the vacuum heating furnace was set to be in a range of $10^{-6}$ Pa to $10^{-3}$ Pa, and the heating temperature and the heating time were set to the conditions shown in Table 2. As such, the power module substrates in Examples 2-1 to 2-13 of the present invention were obtained.

A power module substrate in Comparative Example 2 was obtained using a method which was the same as that used to obtain the power module substrates in Examples 2-1 to 2-13 except the fact that the ceramic substrate and the circuit layer were bonded to each other without the Ti foil being interposed therebetween.

In each of the power module substrates obtained in the aforementioned manner, the initial bonding rate between the circuit layer and the ceramic substrate, and the bonding rate after the thermal cycle test were measured. The number of cycles of thermal cycle tests performed until the occurrence of cracking in the ceramic substrate of the power module substrate was measured, and the bonding rate after the thermal cycle test were evaluated. In each of the obtained power module substrates, the thicknesses of the Ti layer and the first intermetallic compound layer were measured at the bonded interface between the ceramic substrate and the circuit layer.

Similar to Example 1, the bonding rate was evaluated, and the thicknesses of Ti layer and the first intermetallic compound layer were measured. The thermal cycle test was performed as described below.

(Thermal Cycle Test)

One cycle of the thermal cycle test was complete by placing the power module substrate in a liquid phase (Fluorinert) at −40° C. for 5 minutes and 150° C. for 5 minutes using a thermal shock tester TSB-51 manufactured by ESPEC. The thermal cycle tests were performed in 2000 cycles. The power module substrate, in which cracking did not occur in the ceramic substrate even after the thermal cycle tests were performed in 2000 cycles, was denoted by ">2000" in Table 2.

Results of the aforementioned evaluations were shown in Table 2.

TABLE 2

| | Components of Cu—P—Sn-based Brazing Filler Material | Thickness of Cu—P—Sn-based Brazing Filler Material μm | Melting Point of Cu—P—Sn-based Brazing Filler Material | Thickness of Ti Foil μm | Material of Ceramic Substrate | Heating Conditions | |
|---|---|---|---|---|---|---|---|
| | | | | | | Temperature | Time |
| Example 2-1 | Cu-6.3 mass % of P-9.3 mass % of Sn-7 mass % of Ni | 20 | 600° C. | 8 | AlN | 630° C. | 90 min. |
| Example 2-2 | Cu-7 mass % of P-15 mass % of Sn-10 mass % of Ni | 20 | 580° C. | 8 | AlN | 650° C. | 180 min. |
| Example 2-3 | Cu-7 mass % of P-15 mass % of Sn-10 mass % of Ni | 20 | 580° C. | 22 | AlN | 650° C. | 180 min. |
| Example 2-4 | Cu-7 mass % of P-15 mass % of Sn-10 mass % of Ni | 20 | 580° C. | 12 | AlN | 630° C. | 30 min. |
| Example 2-5 | Cu-7 mass % of P-15 mass % of Sn-10 mass % of Ni | 20 | 580° C. | 9 | AlN | 650° C. | 300 min. |
| Example 2-6 | Cu-7 mass % of P-15 mass % of Sn-10 mass % of Ni | 20 | 580° C. | 7 | AlN | 650° C. | 120 min. |
| Example 2-7 | Cu-7 mass % of P-15 mass % of Sn-10 mass % of Ni | 20 | 580° C. | 22 | AlN | 630° C. | 120 min. |
| Example 2-8 | Cu-7 mass % of P-15 mass % of Sn-10 mass % of Ni | 20 | 580° C. | 13 | AlN | 600° C. | 30 min. |
| Example 2-9 | Cu-7 mass % of P-15 mass % of Sn-10 mass % of Ni | 20 | 580° C. | 12 | AlN | 650° C. | 360 min. |
| Example 2-10 | Cu-7 mass % of P-15 mass % of Sn-10 mass % of Ni | 20 | 580° C. | 22 | $Si_3N_4$ | 650° C. | 180 min. |
| Example 2-11 | Cu-7 mass % of P-15 mass % of Sn-10 mass % of Ni | 20 | 580° C. | 12 | $Si_3N_4$ | 630° C. | 30 min. |
| Example 2-12 | Cu-7 mass % of P-15 mass % of Sn-5 mass % of Mn | 20 | 580° C. | 8 | AlN | 650° C. | 180 min. |
| Example 2-13 | Cu-7 mass % of P-15 mass % of Sn-7 mass % of Cr | 20 | 580° C. | 8 | AlN | 650° C. | 180 min. |
| Comparative Example 2 | Cu-7 mass % of P-15 mass % of Sn-10 mass % of Ni | 20 | 580° C. | — | AlN | 650° C. | 90 min. |

| | Thickness of Ti Layer μm | Thickness of First Intermetallic Compound Layer μm | Initial Bonding Rate % | Bonding Rate After Thermal Cycle % | Cracking in Ceramic Substrate Number of Thermal Cycles |
|---|---|---|---|---|---|
| Example 2-1 | 4 | 3 | 97.2 | 96.8 | >2000 |
| Example 2-2 | 1 | 7 | 100.0 | 99.4 | >2000 |
| Example 2-3 | 15 | 7 | 100.0 | 97.2 | >2000 |
| Example 2-4 | 7 | 0.5 | 97.4 | 96.7 | >2000 |
| Example 2-5 | 2 | 10 | 98.5 | 97.8 | >2000 |
| Example 2-6 | 0.3 | 6 | 96.4 | 94.4 | >2000 |
| Example 2-7 | 20 | 4 | 97.3 | 97.1 | 1500-2000 |
| Example 2-8 | 8 | 0.3 | 94.1 | 89.7 | >2000 |
| Example 2-9 | 4 | 12 | 97.9 | 94.6 | 1500-2000 |
| Example 2-10 | 15 | 7 | 97.7 | 96.9 | >2000 |
| Example 2-11 | 7 | 0.5 | 95.7 | 94.8 | >2000 |
| Example 2-12 | 1 | 7 | 97.8 | 97.4 | >2000 |
| Example 2-13 | 1 | 7 | 98.9 | 98.1 | >2000 |
| Comparative Example 2 | — | — | 0.0 | — | — |

As shown in Table 2, in Examples 2-1 to 2-13 of the present invention, the ceramic substrate and the Cu foil were bonded to each other with the Cu—P—Sn-based brazing filler material and the Ti foil being interposed therebetween, and thus it was confirmed that the initial bonding rate between the ceramic substrate and the circuit layer was high, and the ceramic substrate and the circuit layer were sufficiently bonded together. In Examples 2-1 to 2-13 of the present invention, it was confirmed that the bonding rate after the thermal cycle test was high, and the reliability of bonding was high. In Examples 2-1 to 2-13 of the present invention, it was confirmed that the number of cycles of thermal cycle tests, which were performed until the occurrence of cracking in the ceramic substrate, was large, and cracking was unlikely to occur in the ceramic substrate.

In contrast, in Comparative Example 2, the ceramic substrate and the Cu foil were bonded to each other without the Ti foil being interposed therebetween, and thus the ceramic substrate and the Cu foil (circuit layer) could not be bonded to each other.

Example 3

Hereinafter, results of confirmation tests (Example 3) performed to confirm the effects of the embodiments of the present invention will be described.

Sheets of Cu—P—Sn-based brazing filler foil (37 mm×37 mm) with thicknesses shown in Table 3; Ti foils (37 mm×37 mm) with thicknesses shown in Table 3; and Cu foils (37 mm×37 mm×0.3 mm thickness) made of oxygen-free copper were sequentially laminated on first surfaces of ceramic substrates (40 mm×40 mm) shown in Table 3. When the material of the ceramic substrate was AlN, the thickness of the ceramic substrate was set to 0.635 mm, and when the material was Si₃N₄, the thickness was set to 0.32 mm. An Al plate (37 mm×37 mm×1.6 mm thickness) made of Al with a purity of 99.99% was laminated on a second surface of the ceramic substrate with an Al—Si-based brazing filler material (37 mm×37 mm×0.02 mm thickness) being interposed therebetween.

The ceramic substrate, the Cu—P—Sn-based brazing filler material, the Ti foil, the Cu foil, the Al—Si-based brazing filler material, and the Al plate, which were laminated, were placed into and heated in a vacuum heating furnace while being pressurized at a pressure of 15 kgf/cm² (1.47 MPa) in a laminating direction. As a result, the Cu foil was bonded to the first surface of the ceramic substrate. Thereby, a circuit layer was formed. The Al plate was bonded to the second surface of the ceramic substrate, and thereby a metal layer was formed. The internal pressure of the vacuum heating furnace was set to be in a range of $10^{-6}$ Pa to $10^{-3}$ Pa, and the heating temperature and the heating time were set to the conditions shown in Table 3. As such, the power module substrates in Examples 3-1 to 3-13 of the present invention were obtained.

A power module substrate in Comparative Example 3 was obtained using a method which was the same as that used to obtain the power module substrates in Examples 3-1 to 3-13 except the fact that the ceramic substrate and the circuit layer were bonded together without the Ti foil being interposed therebetween.

The following was evaluated for each of the power module substrates obtained in the aforementioned manner: the initial bonding rate between the circuit layer and the ceramic substrate; the bonding rate after the thermal cycle test. In each of the obtained power module substrates, the thicknesses of the Ti layer and the first intermetallic compound layer were measured at the bonded interface between the ceramic substrate and the circuit layer.

Similar to Example 2, the bonding rate was evaluated, the thermal cycle test was performed, and the thicknesses of Ti layer and the first intermetallic compound layer were measured.

Results of the aforementioned evaluations are shown in Table 3.

TABLE 3

| | Components of Cu—P—Sn-based Brazing Filler Material | Thickness of Cu—P—Sn-based Brazing Filler Material μm | Melting Point of Cu—P—Sn-based Brazing Filler Material | Thickness of Ti Foil μm | Material of Ceramic Substrate | Heating Conditions Temperature | Time |
|---|---|---|---|---|---|---|---|
| Example 3-1 | Cu-6.3 mass % of P-9.3 mass % of Sn-7 mass % of Ni | 20 | 600° C. | 9 | AlN | 630° C. | 60 min. |
| Example 3-2 | Cu-7 mass % of P-15 mass % of Sn-10 mass % of Ni | 20 | 580° C. | 6 | AlN | 650° C. | 30 min. |
| Example 3-3 | Cu-7 mass % of P-15 mass % of Sn-10 mass % of Ni | 20 | 580° C. | 20 | AlN | 650° C. | 30 min. |
| Example 3-4 | Cu-7 mass % of P-15 mass % of Sn-10 mass % of Ni | 20 | 580° C. | 8 | AlN | 630° C. | 30 min. |
| Example 3-5 | Cu-7 mass % of P-15 mass % of Sn-10 mass % of Ni | 20 | 580° C. | 9 | AlN | 650° C. | 300 min. |
| Example 3-6 | Cu-7 mass % of P-15 mass % of Sn-10 mass % of Ni | 20 | 580° C. | 6 | AlN | 650° C. | 150 min. |
| Example 3-7 | Cu-7 mass % of P-15 mass % of Sn-10 mass % of Ni | 70 | 580° C. | 22 | AlN | 630° C. | 90 min. |
| Example 3-8 | Cu-7 mass % of P-15 mass % of Sn-10 mass % of Ni | 20 | 580° C. | 10 | AlN | 600° C. | 30 min. |
| Example 3-9 | Cu-7 mass % of P-15 mass % of Sn-10 mass % of Ni | 20 | 580° C. | 10 | AlN | 650° C. | 360 min. |
| Example 3-10 | Cu-7 mass % of P-15 mass % of Sn-10 mass % of Ni | 20 | 580° C. | 8 | Si₃N₄ | 630° C. | 30 min. |
| Example 3-11 | Cu-7 mass % of P-15 mass % of Sn-10 mass % of Ni | 20 | 580° C. | 9 | Si₃N₄ | 650° C. | 300 min. |
| Example 3-12 | Cu-7 mass % of 13-15 mass % of Sn-5 mass % of Mn | 20 | 580° C. | 6 | AlN | 650° C. | 30 min. |
| Example 3-13 | Cu-7 mass % of P-15 mass % of Sn-7 mass % of Cr | 20 | 580° C. | 6 | AlN | 650° C. | 30 min. |
| Comparative Example 3 | Cu-7 mass % of P-15 mass % of Sn-10 mass % of Ni | 20 | 580° C. | — | AlN | 650° C. | 60 min. |

| | Thickness of Ti Layer μm | Thickness of First Intermetallic Compound Layer μm | Initial Bonding Rate % | Bonding Rate After Thermal Cycle % | Cracking in Ceramic Substrate Number of Thermal Cycles |
|---|---|---|---|---|---|
| Example 3-1 | 4 | 2 | 97.8 | 96.5 | >2000 |
| Example 3-2 | 1 | 3 | 99.4 | 97.5 | >2000 |
| Example 3-3 | 15 | 3 | 99.1 | 98.2 | >2000 |
| Example 3-4 | 3 | 0.5 | 97.2 | 96.8 | >2000 |
| Example 3-5 | 2 | 10 | 100.0 | 97.2 | >2000 |
| Example 3-6 | 0.2 | 7 | 96.2 | 90.7 | >2000 |
| Example 3-7 | 20 | 3 | 97.9 | 92.5 | 1000-1500 |
| Example 3-8 | 4 | 0.3 | 93.3 | 90.0 | >2000 |
| Example 3-9 | 2 | 12 | 100.0 | 97.1 | 1500-2000 |
| Example 3-10 | 3 | 0.5 | 95.7 | 93.1 | >2000 |

TABLE 3-continued

| | | | | | |
|---|---|---|---|---|---|
| Example 3-11 | 2 | 10 | 98.0 | 97.5 | >2000 |
| Example 3-12 | 1 | 3 | 98.2 | 96.7 | >2000 |
| Example 3-13 | 1 | 3 | 99.4 | 98.5 | >2000 |
| Comparative Example 3 | — | — | 0.0 | — | — |

As shown in Table 3, in Examples 3-1 to 3-13 of the present invention, the ceramic substrate and the Cu foil were bonded to each other with the Cu—P—Sn-based brazing filler material and the Ti foil being interposed therebetween, and thus it was confirmed that the initial bonding rate between the ceramic substrate and the circuit layer was high, and the ceramic substrate and the circuit layer were sufficiently bonded to each other. In Examples 3-1 to 3-13 of the present invention, it was confirmed that the bonding rate after the thermal cycle test was high, and the reliability of bonding was high. In Examples 3-1 to 3-13 of the present invention, it was confirmed that the number of cycles of thermal cycle tests, which were performed until the occurrence of cracking in the ceramic substrate, was large, and cracking was unlikely to occur in the ceramic substrate.

In contrast, in Comparative Example 3, the ceramic substrate and the Cu foil were bonded to each other without the Ti foil being interposed therebetween, and thus the ceramic substrate and the Cu foil (circuit layer) could not be bonded to each other.

INDUSTRIAL APPLICABILITY

In the bonded body and the power module substrate of the present invention, when the bonded body and the power module substrate undergo a thermal cycle, the occurrence of cracking in the ceramic member can be limited and the reliability of bonding between the ceramic member and a Cu member can be improved. For this reason, the bonded body and the power module substrate of the present invention are suitably used in a power module under severe operating environments, for example, a high-power control power semiconductor element used to control wind power generation systems and electric vehicles such as electric automobiles.

REFERENCE SIGNS LIST

10, 110, 210: POWER MODULE SUBSTRATE (BONDED BODY)
11: CERAMIC SUBSTRATE (CERAMIC MEMBER)
12, 112, 212: CIRCUIT LAYER
13.113, 213: METAL, LAYER
14: Cu—Sn LAYER (FIRST Cu—Sn LAYER)
114: Cu—Sn LAYER (SECOND Cu—Sn LAYER)
15: Ti LAYER (FIRST Ti LAYER)
115: Ti LAYER (SECOND Ti LAYER)
16: FIRST INTERMETALLIC COMPOUND LAYER
17: SECOND INTERMETALLIC COMPOUND LAYER
116: FIRST INTERMETALLIC COMPOUND LAYER (THIRD INTERMETALLIC COMPOUND LAYER)
117: SECOND INTERMETALLIC COMPOUND LAYER (FOURTH INTERMETALLIC COMPOUND LAYER)
22, 122, 123, 222: Cu FOIL (Cu MEMBER)

The invention claimed is:
1. A bonded body comprising:
a ceramic member made of ceramics; and
a Cu member which is made of Cu or a Cu alloy and bonded to the ceramic member through a Cu—P—Sn-based brazing filler material and a Ti material,
wherein a Cu—Sn layer, which is positioned close to the ceramic member and in which Sn forms a solid solution with Cu, and a Ti layer which is positioned between the Cu member and the Cu—Sn layer, are formed at a bonded interface between the ceramic member and the Cu member,
a first intermetallic compound layer made of Cu and Ti is formed between the Cu member and the Ti layer, and
a second intermetallic compound layer containing P is formed between the Cu—Sn layer and the Ti layer.
2. The bonded body according to claim 1, wherein a thickness of the first intermetallic compound layer is set to be in a range of 0.5 μm to 10 μm.
3. The bonded body according to claim 1, wherein a thickness of the Ti layer is set to be in a range of 1 μm to 15 μm.
4. A power module substrate comprising the bonded body according to claim 1, wherein the substrate further comprises:
a ceramic substrate formed of the ceramic member; and
a circuit layer formed by bonding a Cu foil formed of the Cu member to a first surface of the ceramic substrate through the Cu—P—Sn-based brazing filler material and the Ti material,
wherein the Cu—Sn layer, which is positioned close to the ceramic substrate and in which Sn forms a solid solution with Cu, and the Ti layer which is positioned between the circuit layer and the Cu—Sn layer, are formed at a bonded interface between the ceramic substrate and the circuit layer,
the first intermetallic compound layer made of Cu and Ti is formed between the circuit layer and the Ti layer, and
the second intermetallic compound layer containing P is formed between the Cu—Sn layer and the Ti layer.
5. The power module substrate according to claim 4, wherein a metal layer is formed on a second surface of the ceramic substrate.
6. The power module substrate according to claim 5, wherein the metal layer is formed by bonding a Cu foil made of Cu or a Cu alloy to the second surface of the ceramic substrate through a Cu—P—Sn-based brazing filler material and a Ti material,
a Cu—Sn layer, which is positioned close to the ceramic substrate and in which Sn forms a solid solution with Cu, and a Ti layer which is positioned between the metal layer and the Cu—Sn layer, are formed at a bonded interface between the ceramic substrate and the metal layer,
a first intermetallic compound layer made of Cu and Ti is formed between the metal layer and the Ti layer, and
a second intermetallic compound layer containing P is formed between the Cu—Sn layer and the Ti layer.
7. The power module substrate according to claim 5, wherein the metal layer is made of Al or an Al alloy.
8. The power module substrate according to claim 4, wherein a thickness of the Ti layer is set to be in a range of 1 μm to 15 μm.
9. The bonded body according to claim 2, wherein a thickness of the Ti layer is set to be in a range of 1 μm to 15 μm.

10. A power module substrate comprising the bonded body according to claim 2, wherein the substrate further comprises:
   a ceramic substrate formed of the ceramic member; and
   a circuit layer formed by bonding a Cu foil formed of the Cu member to a first surface of the ceramic substrate through the Cu—P—Sn-based brazing filler material and the Ti material,
   wherein the Cu—Sn layer, which is positioned close to the ceramic substrate and in which Sn forms a solid solution with Cu, and the Ti layer which is positioned between the circuit layer and the Cu—Sn layer, are formed at a bonded interface between the ceramic substrate and the circuit layer,
   the first intermetallic compound layer made of Cu and Ti is formed between the circuit layer and the Ti layer, and
   the second intermetallic compound layer containing P is formed between the Cu—Sn layer and the Ti layer.

11. A power module substrate comprising the bonded body according to claim 3, wherein the substrate further comprises:
   a ceramic substrate formed of the ceramic member; and
   a circuit layer formed by bonding a Cu foil formed of the Cu member to a first surface of the ceramic substrate through the Cu—P—Sn-based brazing filler material and the Ti material,
   wherein the Cu—Sn layer, which is positioned close to the ceramic substrate and in which Sn forms a solid solution with Cu, and the Ti layer which is positioned between the circuit layer and the Cu—Sn layer, are formed at a bonded interface between the ceramic substrate and the circuit layer,
   the first intermetallic compound layer made of Cu and Ti is formed between the circuit layer and the Ti layer, and
   the second intermetallic compound layer containing P is formed between the Cu—Sn layer and the Ti layer.

12. A power module substrate comprising the bonded body according to claim 9, wherein the substrate further comprises:
   a ceramic substrate formed of the ceramic member; and
   a circuit layer formed by bonding a Cu foil formed of the Cu member to a first surface of the ceramic substrate through the Cu—P—Sn-based brazing filler material and the Ti material,
   wherein the Cu—Sn layer, which is positioned close to the ceramic substrate and in which Sn forms a solid solution with Cu, and the Ti layer which is positioned between the circuit layer and the Cu—Sn layer, are formed at a bonded interface between the ceramic substrate and the circuit layer,
   the first intermetallic compound layer made of Cu and Ti is formed between the circuit layer and the Ti layer, and
   the second intermetallic compound layer containing P is formed between the Cu—Sn layer and the Ti layer.

13. The power module substrate according to claim 10, wherein a metal layer is formed on a second surface of the ceramic substrate.

14. The power module substrate according to claim 11, wherein a metal layer is formed on a second surface of the ceramic substrate.

15. The power module substrate according to claim 12, wherein a metal layer is formed on a second surface of the ceramic substrate.

16. The power module substrate according to claim 13, wherein the metal layer is formed by bonding a Cu foil made of Cu or a Cu alloy to the second surface of the ceramic substrate through a Cu—P—Sn-based brazing filler material and a Ti material,
   a Cu—Sn layer, which is positioned close to the ceramic substrate and in which Sn forms a solid solution with Cu, and a Ti layer which is positioned between the metal layer and the Cu—Sn layer, are formed at a bonded interface between the ceramic substrate and the metal layer,
   a first intermetallic compound layer made of Cu and Ti is formed between the metal layer and the Ti layer, and
   a second intermetallic compound layer containing P is formed between the Cu—Sn layer and the Ti layer.

17. The power module substrate according to claim 14, wherein the metal layer is formed by bonding a Cu foil made of Cu or a Cu alloy to the second surface of the ceramic substrate through a Cu—P—Sn-based brazing filler material and a Ti material,
   a Cu—Sn layer, which is positioned close to the ceramic substrate and in which Sn forms a solid solution with Cu, and a Ti layer which is positioned between the metal layer and the Cu—Sn layer, are formed at a bonded interface between the ceramic substrate and the metal layer,
   a first intermetallic compound layer made of Cu and Ti is formed between the metal layer and the Ti layer, and
   a second intermetallic compound layer containing P is formed between the Cu—Sn layer and the Ti layer.

18. The power module substrate according to claim 15, wherein the metal layer is formed by bonding a Cu foil made of Cu or a Cu alloy to the second surface of the ceramic substrate through a Cu—P—Sn-based brazing filler material and a Ti material,
   a Cu—Sn layer, which is positioned close to the ceramic substrate and in which Sn forms a solid solution with Cu, and a Ti layer which is positioned between the metal layer and the Cu—Sn layer, are formed at a bonded interface between the ceramic substrate and the metal layer,
   a first intermetallic compound layer made of Cu and Ti is formed between the metal layer and the Ti layer, and
   a second intermetallic compound layer containing P is formed between the Cu—Sn layer and the Ti layer.

19. The power module substrate according to claim 13, wherein the metal layer is made of Al or an Al alloy.

20. The power module substrate according to claim 14, wherein the metal layer is made of Al or an Al alloy.

* * * * *